United States Patent
Abe

(10) Patent No.: US 7,863,586 B2
(45) Date of Patent: Jan. 4, 2011

(54) WRITING DATA CREATION METHOD AND CHARGED PARTICLE BEAM WRITING APPARATUS

(75) Inventor: Takayuki Abe, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 190 days.

(21) Appl. No.: 12/199,158

(22) Filed: Aug. 27, 2008

(65) Prior Publication Data
US 2009/0057570 A1 Mar. 5, 2009

(30) Foreign Application Priority Data
Aug. 29, 2007 (JP) ............................ 2007-222645

(51) Int. Cl.
G01N 23/00 (2006.01)
G21K 7/00 (2006.01)

(52) U.S. Cl. .................. 250/492.22; 250/492.1; 250/492.3; 250/492.21

(58) Field of Classification Search ............. 250/492.1, 250/492.21, 492.3, 493.1
See application file for complete search history.

(56) References Cited

U.S. PATENT DOCUMENTS

| | | | |
|---|---|---|---|
| 6,218,060 B1 | 4/2001 | Yasuda et al. | |
| 6,333,138 B1 * | 12/2001 | Higashikawa et al. | 430/296 |
| 6,465,783 B1 * | 10/2002 | Nakasuji | 250/311 |
| 6,593,584 B2 * | 7/2003 | Krans et al. | 250/492.2 |
| 7,067,830 B2 * | 6/2006 | Yoda et al. | 250/492.22 |
| 7,075,093 B2 * | 7/2006 | Gorski et al. | 250/492.2 |
| 2005/0253093 A1 * | 11/2005 | Gorski et al. | 250/492.22 |
| 2006/0017021 A1 * | 1/2006 | Yoda et al. | 250/492.23 |
| 2006/0017049 A1 * | 1/2006 | Pilla | 257/10 |
| 2006/0055903 A1 * | 3/2006 | Thuren et al. | 355/53 |
| 2008/0049204 A1 * | 2/2008 | Yabara et al. | 355/53 |
| 2009/0057570 A1 * | 3/2009 | Abe | 250/492.2 |
| 2009/0212213 A1 * | 8/2009 | Nakasuji et al. | 250/310 |
| 2010/0019172 A1 * | 1/2010 | Yamada et al. | 250/492.2 |

FOREIGN PATENT DOCUMENTS

JP 11-329322 11/1999

OTHER PUBLICATIONS

H. Yasuda, et al., "Evaluation of Multi-column-cell (MCC) PoC (Proof of Concept) System", $3^{rd}$ Symposium of Charged Particle Optics, pp. 125-128 (With English Translation).

(Continued)

Primary Examiner—David A Vanore
(74) Attorney, Agent, or Firm—Oblon, Spivak, McClelland, Maier & Neustadt, L.L.P.

(57) ABSTRACT

A method of creating writing data for writing a pattern on a target workpiece by using a writing apparatus provided with a plurality of columns that emit charged particle beams includes inputting information on distance between optical centers of the plurality of columns, inputting layout data and virtually dividing a writing region indicated by the layout data into a plurality of small regions, by a width of one integer-th of the distance indicated by the information on distance, converting, for each small region, the layout data to a format adaptable to the writing apparatus to create, for the each small region, the writing data whose writing region is divided into the small regions, and outputting the writing data.

9 Claims, 14 Drawing Sheets

OTHER PUBLICATIONS

T. Haraguchi, et al., "Development of electromagnetic lenses for multielectron beam lithography system", J.Vac.Sci.Technol.B20 (6), Nov./Dec. 2002, pp. 2726-2729.

T. Haraguchi, et al., "Multicolumn cell; Evaluation of the proof of concept system", J.Vac.Sci.Technol.B22 (3), May/Jun. 2004, pp. 985-988.

* cited by examiner

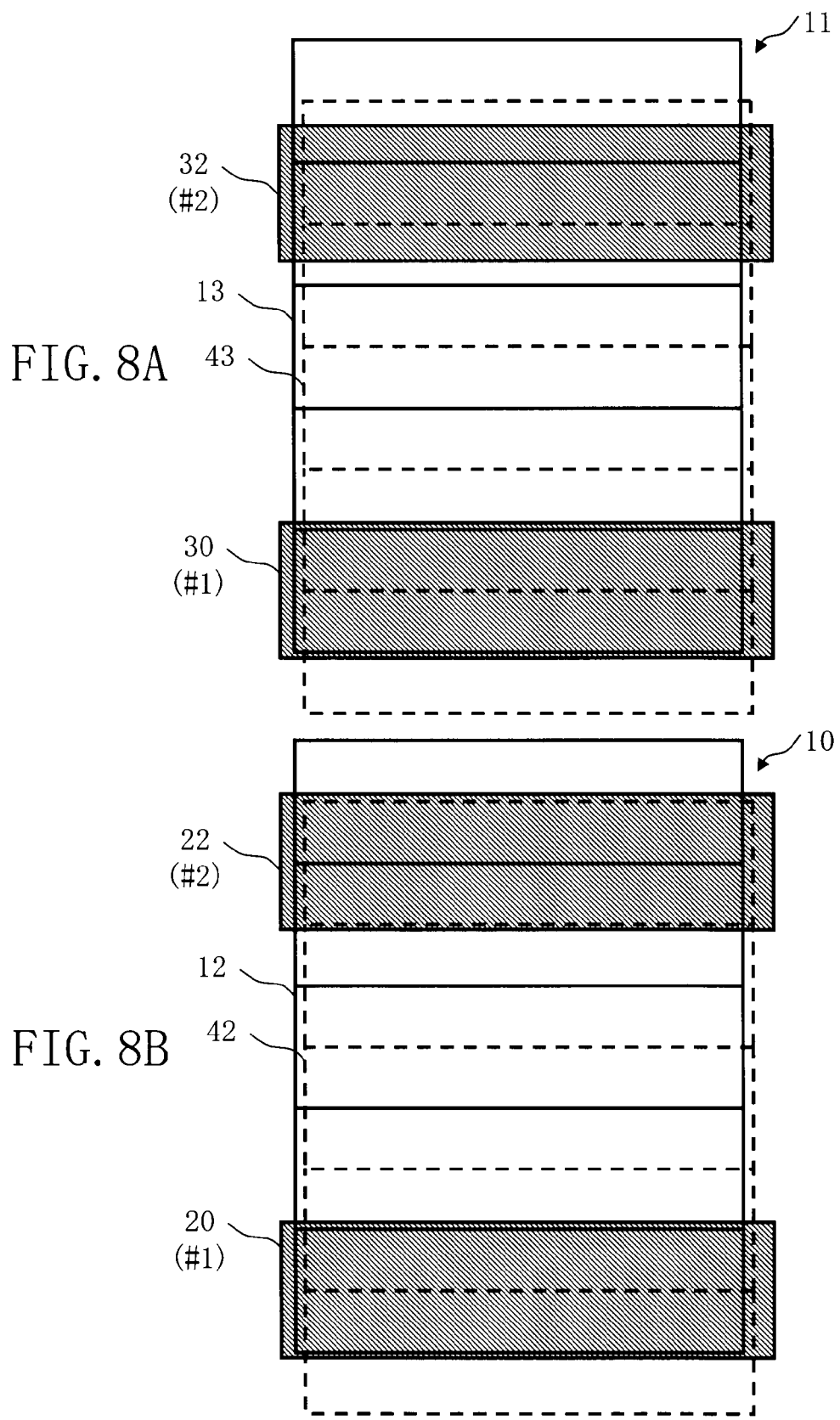

Data Used By Column (#2) In Procedure 1 Is Utilized For Writing By Column (#1) In Procedure 2.

WRITING DATA CREATION METHOD AND CHARGED PARTICLE BEAM WRITING APPARATUS

CROSS-REFERENCE TO RELATED APPLICATION

This application is based upon and claims the benefit of priority from the prior Japanese Patent Application No. 2007-222645 filed on Aug. 29, 2007 in Japan, the entire contents of which are incorporated herein by reference.

BACKGROUND OF THE INVENTION

1. Field of the Invention

The present invention relates to a writing data creation method and a charged particle beam writing apparatus, and for example, it relates to a writing apparatus in which multi-columns for writing a pattern on a target workpiece are provided.

2. Description of Related Art

A lithography technique that advances microminiaturization of semiconductor devices is an extremely important process only which forms patterns in semiconductor manufacturing processes. In recent years, with high integration of large-scale integrated circuits (LSI), a circuit critical dimension required for semiconductor devices becomes minuter year by year. In order to form a desired circuit pattern on semiconductor devices, there is required a master pattern (also called a mask or a reticle) of high precision. The electron beam writing technique intrinsically has excellent resolution and is used for manufacturing a highly precise master pattern.

FIG. 15 shows a schematic diagram for illustrating operations of a variable-shaped type electron beam (EB) writing apparatus. As shown in the figure, the variable-shaped electron beam writing apparatus, including two aperture plates, operates as follows: A first or "upper" aperture plate 410 has a rectangular opening or "hole" 411 for shaping an electron beam 330. This shape of the rectangular opening may also be a square, a rhombus, a rhomboid, etc. A second or "lower" aperture plate 420 has a variable-shaped opening 421 for shaping the electron beam 330 that passed through the opening 411 into a desired rectangular shape. The electron beam 330 being emitted from a charged particle source 430 and having passed through the opening 411 is deflected by a deflector to penetrate a part of the variable-shaped opening 421 and thereby to irradiate a target workpiece or "sample" mounted on a stage which continuously moves in one predetermined direction (e.g. X direction) during the writing. In other words, a rectangular shape capable of passing through both the opening 411 and the variable-shaped opening 421 is written in the writing region of a target workpiece 340 on the stage. This method of writing or "forming" a given shape by letting beams pass through both the opening 411 and the variable-shaped opening 421 is referred to as a "variable shaping" method.

Conventionally, there is used an electron beam writing apparatus which emits one beam (single beam) from a single column where one optical system column is loaded in one electron lens barrel. In the electron beam writing apparatus using a single beam, an LSI pattern is virtually divided into regions, each of which is called a stripe, a frame or a field, and by writing them in order, the whole LSI pattern is written or "drawn." In the method of continuously moving the stage on which a mask is placed, the region is called a stripe or a frame. In the method of writing by a step and repeat operation, the region is called a field. The size of the region is determined based on a maximum deflection region of a corresponding deflector, and then, the region is divided according to the size.

On the other hand, compared with the writing apparatus employing the single column system mentioned above, there is developed a writing apparatus employing a multi-column cell (MCC) system where two or more optical system columns are loaded in one electron lens barrel. Each column is structured to have the same writing conditions, and a variable shaping writing is performed in each column respectively. (For example, refer to [1] "Multi-column cell MCC-PoC (proof of concept) system evaluation", by H. Yasuda, T. Haraguchi, et al., the third Symposium on Charged Particle Optics, pp. 125-128, Sep. 18-19, 2003, [2] "Development of electromagnetic lenses for multielectron beam lithography system", by T. Haraguchi, T. Sakazaki, S. Hamaguchi and H. Yasuda, 2726, J. Vac. Sci. Technol. (Journal of Vacuum Science and Technology) B20 (6), and November/December 2002, and [3] "Multicolumn cell: Evaluation of the proof of concept system", by T. Haraguchi, T. Sakazaki, T. Satoh, M. Nakano, S. Hamaguchi, T. Kiuchi, H. Yabara and H. Yasuda, 985, J. Vac. Sci. Technol. B22 (3), May/June 2004.) When the multi-column system is adopted, the region dividing method of the single column system mentioned above cannot be used as it is. This is because the distance between the optical centers of both the columns is unique to the apparatus, and for example, it is fixed to 1.1 cm. Then, the distance does not match with the positional relation of a frame or a stripe. If writing is started and continued in such a state, since there exists a region that overflows from a region where deflection can be performed at stable precision, the writing will be executed, in many cases, while deflection is performed up to a position outside the range of each frame. Thereby, there has been a problem of deterioration of writing precision.

When a multi-column system is adopted, writing data is required for each column. Therefore, the number of times of required operation processing increases, and a calculator for them becomes necessary. Thus, there is also a problem that the apparatus itself will be enlarged. Therefore, miniaturization of the apparatus is required, but conventionally it has not been sufficiently solved yet. Moreover, it is also required to shorten the writing time by adopting the multi-column system, but however concrete methods have not been conventionally proposed yet.

As mentioned above, there is a problem that the region dividing method of the single column system stated above cannot be employed as it is because the distance between the optical centers of each column of a multi-column system does not match with the positional relation of a frame or a stripe. Moreover, in the apparatus of the multi-column system, it is requested to reduce the number of parts, and the volume or the number of times of operation processing. Furthermore, it is requested to shorten the time of writing.

BRIEF SUMMARY OF THE INVENTION

An object of the present invention is to provide a creation method of writing data whose region is divided so as to be used in the apparatus of the multi-column system, and to provide a charged particle beam writing apparatus in which the number of parts and the number of operation processing are reduced and the writing time is shortened.

In accordance with one aspect of the present invention, a method of creating writing data for writing a pattern on a target workpiece by using a writing apparatus provided with a plurality of columns that emit charged particle beams, the method includes inputting information on distance between optical centers of the plurality of columns, inputting layout data and virtually dividing a writing region indicated by the layout data into a plurality of small regions, by a width of one integer-th of the distance indicated by the information on distance, converting, for each small region, the layout data to a format adaptable to the writing apparatus to create, for the each small region, the writing data whose writing region is divided into the small regions, and outputting the writing data.

In accordance with another aspect of the present invention, a charged particle beam writing apparatus includes a storage unit configured to temporarily store a k-th frame data of a first chip, a first deflection control unit configured to read the k-th frame data from the storage unit, and control a deflection position of a first charged particle beam, a first column configured to emit the first charged particle beam onto a k-th frame position of the first chip, based on the k-th frame data read by the first deflection control unit, a second deflection control unit configured to read the k-th frame data from the storage unit after the k-th frame data having been read from the storage unit by the first deflection control unit and before the k-th frame data being rewritten by other data, and control a deflection position of a second charged particle beam, and a second column configured to emit the second charged particle beam onto the k-th frame position of a second chip, based on the k-th frame data read by the second deflection control unit.

In accordance with another aspect of the present invention, a charged particle beam writing apparatus includes a stage configured to mount a target workpiece thereon and move in a predetermined direction, and n columns, arranged in the predetermined direction in order, configured to write a corresponding pattern in a small region of 1/n of a writing region of the target workpiece, using a charged particle beam, respectively.

In accordance with another aspect of the present invention, a charged particle beam writing apparatus includes a stage configured to mount a target workpiece thereon and move in a predetermined direction, and n columns, arranged in the predetermined direction in order, configured to perform writing processing using a charged particle beam, wherein, in a case that at least two columns are respectively located above a region where a number of shots is larger than that of other region, the apparatus has a function of performing writing processing while giving priority than other case.

BRIEF DESCRIPTION OF THE DRAWINGS

FIGS. 8A and FIG. 8B show schematic diagrams for illustrating an example of application in the case of performing multiple writing by the multi-columns described in Embodiment 1 when compared with a conventional method;

DETAILED DESCRIPTION OF THE INVENTION

In the following Embodiments, a structure utilizing an electron beam, as an example of a charged particle beam, will be described. The charged particle beam is not limited to the electron beam, and may be a beam using other charged particle, such as an ion beam.

Embodiment 1

Figure 1:
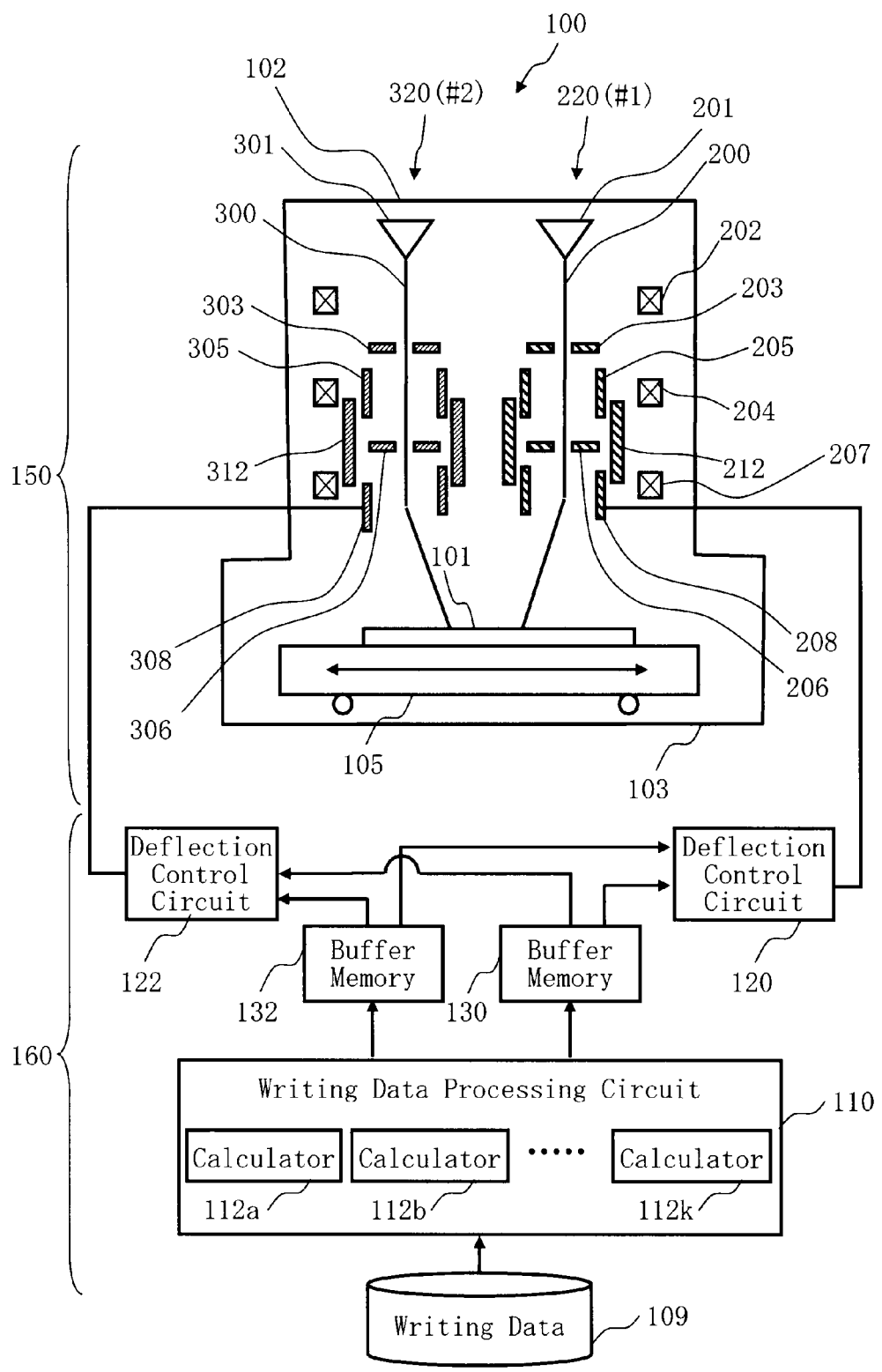
FIG. 1 shows a schematic diagram illustrating a structure of a writing apparatus in Embodiment 1.

FIG. 1 shows a schematic diagram illustrating a structure of a writing apparatus described in Embodiment 1. In FIG. 1, a pattern writing apparatus 100 includes a writing unit 150 and a control unit 160. The pattern writing apparatus 100 serves as an example of a charged particle beam writing apparatus. The pattern writing apparatus 100 writes or "draws" a desired pattern on a target workpiece 101. The control unit 160 includes a magnetic disk drive 109, a writing data processing circuit 110, deflection control circuits 120 and 122, and buffer memories 130 and 132. The writing data processing circuit 110 includes a plurality of calculators 112a to 112k. In an electron lens barrel 102, there are arranged electron gun assemblies 201 and 301, an illumination lens 202, first aperture plates 203 and 303, a projection lens 204, deflectors 205 and 305, second aperture plates 206 and 306, an objective lens 207, deflectors 208 and 308 and shielding cylinders 212 and 312. Then, a first column 220 (#1) is composed of the electron gun assembly 201, the first aperture plate 203, the deflector 205, the second aperture plate 206, the shielding cylinder 212 and the deflector 208. A second column 320 (#2) is composed of the electron gun assembly 301, the first aperture plate 303, the deflector 305, the second aperture plate 306, the shielding cylinder 312, and the deflector 308. In the electron lens barrel 102, a plurality of columns are provided while the lens systems, such as the illumination lens 202, the projection lens 204, and the objective lens 207 are used in common among the columns. The subsystem which controls an optical path of an independent electron beam is herein called a column. In a writing chamber 103, there is an XY stage 105 movably arranged. On the XY stage 105, there is placed the target workpiece 101. As the target workpiece 101, for example, a wafer on which a semiconductor device is formed and an exposure mask for exposing or "transferring and printing" a pattern onto a wafer are included. This mask includes a mask blank where no patterns are formed, for example. Moreover, writing data is stored in the magnetic disk device 109. While only the structure elements necessary for explaining Embodiment 1 are shown in FIG. 1, it should be understood that other structure elements generally necessary for the pattern writing apparatus 100 may also be included.

The writing data processing circuit 110 reads writing data from the magnetic disk drive 109, and converts it into data of a format unique to the apparatus by performing a parallel processing of a plurality of calculators 112. Position deflection data of the column 220 is output to the buffer memory 130 or the buffer memory 132. Similarly, position deflection data of the column 320 is output to the buffer memory 130 or the buffer memory 132. One of the deflection data in the buffer memory 130 or the buffer memory 132 is output to the deflection control circuit 120 for the column 220. Similarly, the other of the deflection data in the buffer memory 132 or the buffer memory 130 is output to the deflection control circuit 122 for the column 320. Then, the deflector 208 is deflection-controlled based on an output from the deflection control circuit 120. Similarly, the deflector 308 is deflection-controlled based on an output from the deflection control circuit 122. The deflection control circuits 120 and 122 serve as examples of a deflection control unit. The buffer memories 130 and 132 serve as examples of a storage unit or a storage device.

Figure 2:
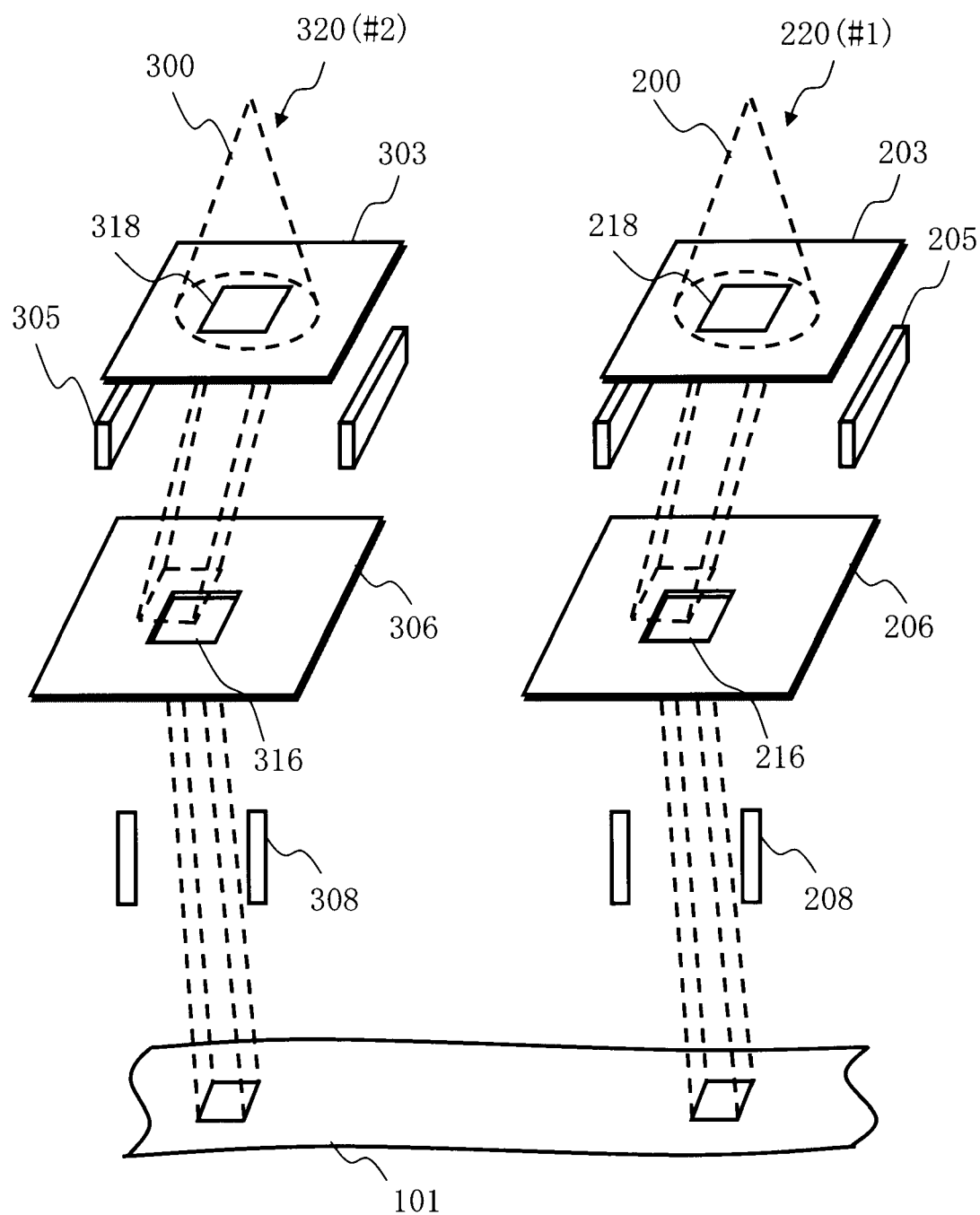
FIG. 2 shows a schematic diagram for illustrating operations of a writing apparatus in Embodiment 1.

FIG. 2 shows a schematic diagram for illustrating operations of the writing apparatus described in Embodiment 1. First, operations at the column 220 side will be explained. An electron beam 200 emitted from the electron gun assembly 201, which is an example of an emitting unit, irradiates the whole of the first aperture plate 203 having an opening or "hole" 218 in the shape of a rectangle, by using the illumination lens 202. Then, the electron beam 200 is shaped to be a rectangle. Such a rectangular shape may be a square, rhombus, rhomboid, etc. Then, after having passed through the first aperture plate 203, the electron beam 200 of a first aperture image is projected onto the second aperture plate 206 by the projection lens 204. The position of the first aperture image on the second aperture plate 206 is deflection-controlled by the deflector 205, and the shape and size of the beam can be changed by a forming opening 216. That is, the electron beam 200 is formed. After having passed through the second aperture plate 206, the electron beam 200 of a second aperture image is focused by the objective lens 207 and deflected by the deflector 208 to reach a desired position on the target workpiece 101 placed on the XY stage 105 which moves continuously.

Operations at the column 320 side are similar to those at the column 220 side as follows: An electron beam 300 emitted from the electron gun assembly 301, which is an example of an emitting unit, irradiates the whole of the first aperture plate 303 having an opening or "hole" 318 in the shape of a rectangle by using the illumination lens 202. Then, the electron beam 300 is shaped to be a rectangle. Such a rectangular shape may be a square, rhombus, rhomboid, etc. Then, after having passed through the first aperture plate 303, the electron beam 300 of a first aperture image is projected onto the second aperture plate 306 by the projection lens 204. The position of the first aperture image on the second aperture plate 306 is deflection-controlled by the deflector 305, and the shape and size of the beam can be changed by a forming opening 316. That is, the electron beam 300 is formed. After having passed through the second aperture plate 306, the electron beam 300 of a second aperture image is focused by the objective lens 207 and deflected by the deflector 308 to reach a desired position on the target workpiece 101 placed on the XY stage 105 which moves continuously.

Figure 3:
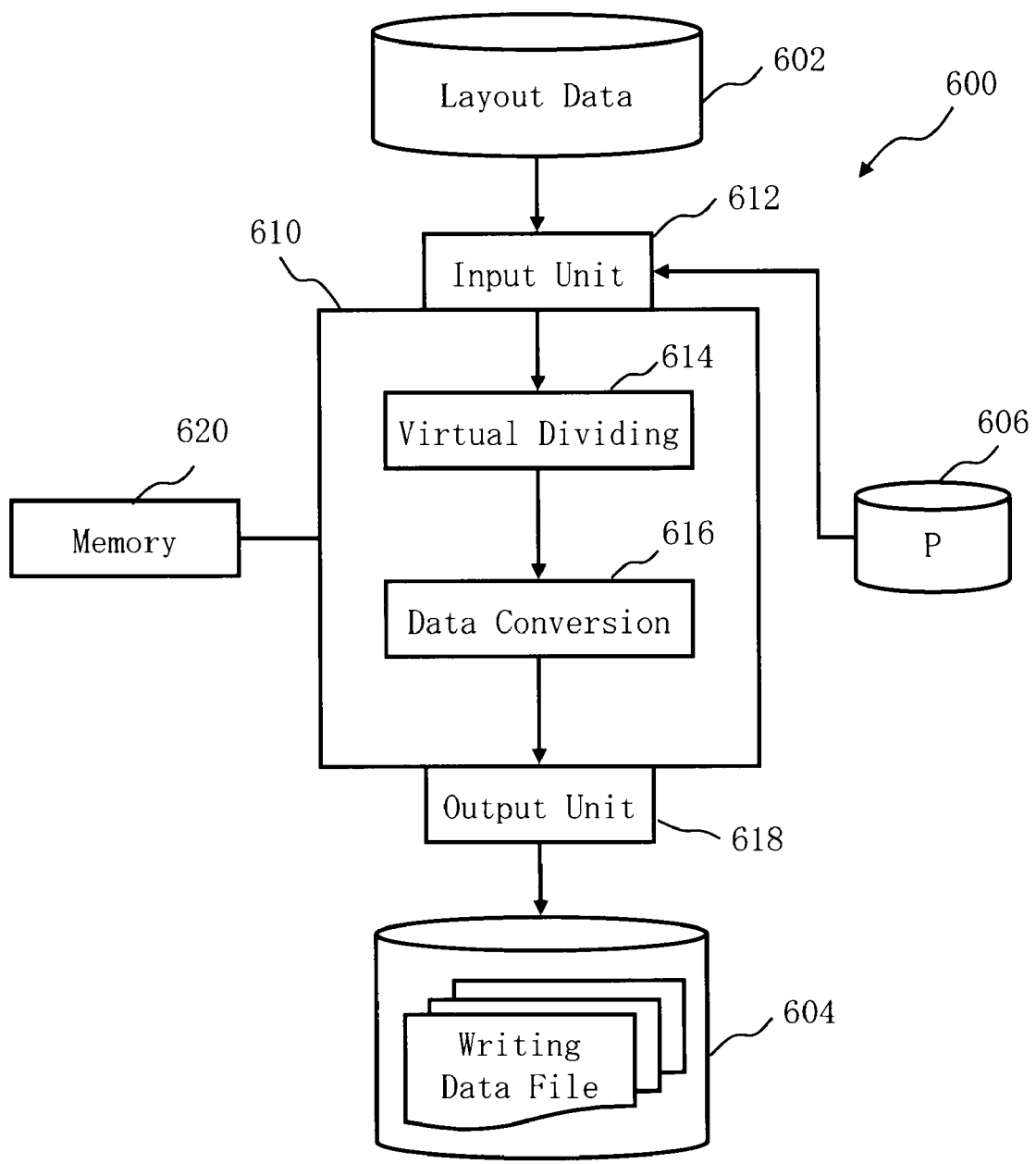
FIG. 3 shows a schematic diagram illustrating a structure of a writing data creation apparatus in Embodiment 1.

FIG. 3 shows a schematic diagram illustrating the structure of a writing data creation apparatus described in Embodiment 1. In FIG. 3, a writing data creation apparatus 600 includes magnetic disk drives 602, 604, and 606, a control calculation unit 610, an input unit 612, an output unit 618, and a memory 620. The control calculation unit 610 includes functions of a virtual dividing unit 614 and a data conversion unit 616. Each information input into the control calculation unit 610 or each information during operation processing or after processing is stored in the memory 620 each time. While only the structure elements necessary for explaining Embodiment 1 are shown in FIG. 3, it should be understood that other structure elements generally necessary for the writing data creation apparatus 600 may also be included.

Moreover, although it is illustrated in FIG. 3 that processing of each functions, such as the virtual dividing unit 614 and the data conversion unit 616, is performed by the control calculation unit 610 serving as an example of a computer, it is not limited thereto. It may be executed by hardware, such as an electric circuit. Alternatively, processing of the function may be executed by a combination of hardware of an electric circuit and software, or a combination of hardware and firmware.

Figure 4:
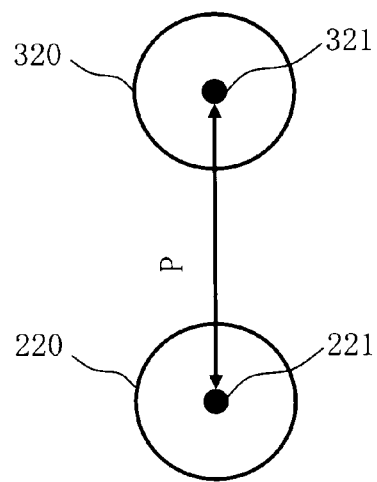
FIG. 4 shows a schematic diagram for illustrating the distance between optical centers of two columns in Embodiment 1.

In performing the electron beam writing mentioned above, first, the layout of a semiconductor integrated circuit is designed, and layout data (design data) is generated. Then, the layout data is converted by the writing data creation apparatus 600, to generate writing data to be input into the writing apparatus 100. In the magnetic disk drive 602, layout data is stored. In the magnetic disk drive 606, information on distance between the optical centers of the columns 220 and 320 is stored. Drawing data is created as follows:

First, as an input step, the input unit 612 inputs the information on distance between the optical centers of the columns 220 and 320. FIG. 4 shows a schematic diagram for illustrating the distance between the optical centers of the two columns described in Embodiment 1. FIG. 4 shows the case where the distance between an optical center 221 of the column 220 and an optical center 321 of the column 320 is P. Therefore, the value P is stored in the magnetic disk drive 606 as distance information between the optical centers of the columns 220 and 320.

Next, as a dividing step, the input unit 612 inputs the layout data from the magnetic disk drive 602. Then, the virtual dividing unit 614 virtually divides the writing region indicated by the layout data into a plurality of frames (small regions) by the width of one integer-th of the distance indicated by the distance information.

Next, as a creation step, the data conversion unit 616 converts the layout data, whose region is divided into frames, into data of a format adaptable to the writing apparatus 100 in order to create writing data, whose region is divided into frames.

Then, as an output step, the output unit 618 outputs the writing data to the magnetic disk drive 604. The writing data is organized into a data file for each frame so as to be stored. This writing data, having been organized into a data file for each frame, is transmitted and stored in the magnetic disk drive 109 of the writing apparatus 100.

Figures 5A, 5B:
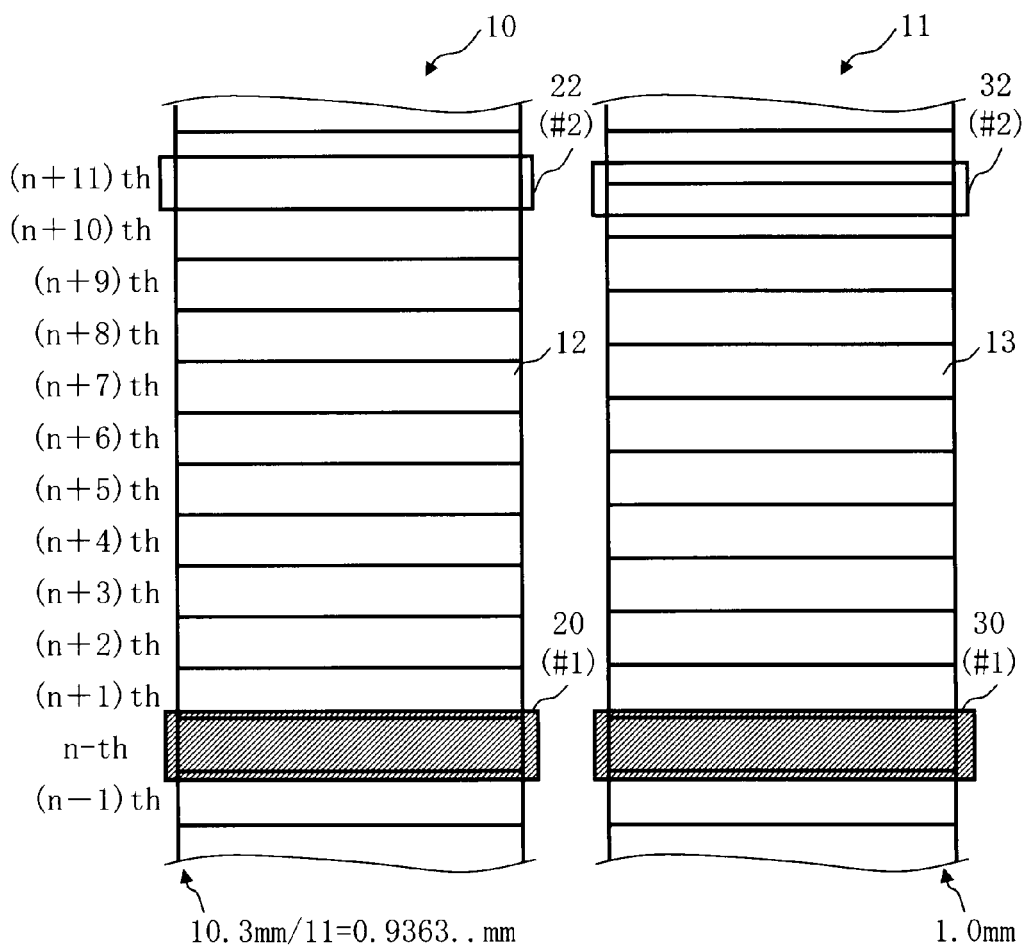
FIGS. 5A and 5B show schematic diagrams for illustrating how to divide a region into frames according to Embodiment 1 when compared with a conventional method.

FIGS. 5A and 5B show schematic diagrams for illustrating how to divide the region into frames according to Embodiment 1, when compared with a conventional method. They show frame divisions of the conventional method and of Embodiment 1 in the case of the distance P between two optical centers of the columns 220 and 320 being 10.3 mm, for example. In the conventional way, for example, a writing region 11 indicated by the layout data is virtually divided into a plurality of frames 13 each having a width of 1 mm, namely virtually dividing the layout data by 1 mm, regardless of the distance P. That is, the writing data is created to have the width of 1 mm. As a result, positional displacement occurs as shown in FIG. 5B. There are shown in FIG. 5B a region 30 which can be written by the first column, and a region 32 which can be written by the second column. As shown in FIG. 5B, when the first column performs writing processing for the n-th frame 13, the region 32, which can be written by the second column, does not accord with the positional relation of the divided frame 13, thereby writing processing cannot be performed by the second column. Alternatively, if the writing is continued in such a state, there will exist a region protruding from the deflectable region 32. Therefore, there will be many cases in which the writing in the frames is performed while even the position outside the range of the regions 32 is deflected. Thus, writing precision is deteriorated. On the other hand, according to Embodiment 1, the value obtained by dividing the distance P by an integer n is defined as a frame width. Then, it is preferable to set the value of the integer n so that a calculated quotient may not exceed 1 mm+α being a writable width.

In the case of FIG. 5A, the value "11" is used as the integer n. Thereby, the frame width can be within the width deflectable by the deflectors 208 and 308. In this case, a writing region 10 indicated by the layout data is virtually divided into a plurality of frames 12 each having a width of 0.9363 mm, namely virtually dividing the layout data by 0.9363 mm, which is obtained by dividing 10.3 mm by 11. In FIG. 5A, there are shown a region 20 which can be written by the first column 220, and a region 22 which can be written by the second column 320. As shown in FIG. 5A, when the first column 220 performs writing processing for the n-th frame 12, the position of the region 22, which can be written by the second column 320, can accord with the position of the (n+11)-th frame 12. Thus, it is possible to perform writing processing even by the second column 320.

As mentioned above, the writing data for writing a pattern on the target workpiece 101 can be created by using the writing apparatus 100 in which a plurality of columns to emit electron beams are provided. In Embodiment 1, the region of writing data is divided by the width of one integer-th of the distance between the optical centers of a plurality of columns, thereby eliminating positional displacement. Consequently, not only can the writing time be shortened by simultaneously or substantially simultaneously performing writing processing by using the multi-columns, but also highly precise writing processing can be performed. In the following, application examples will be described.

Figure 6A:
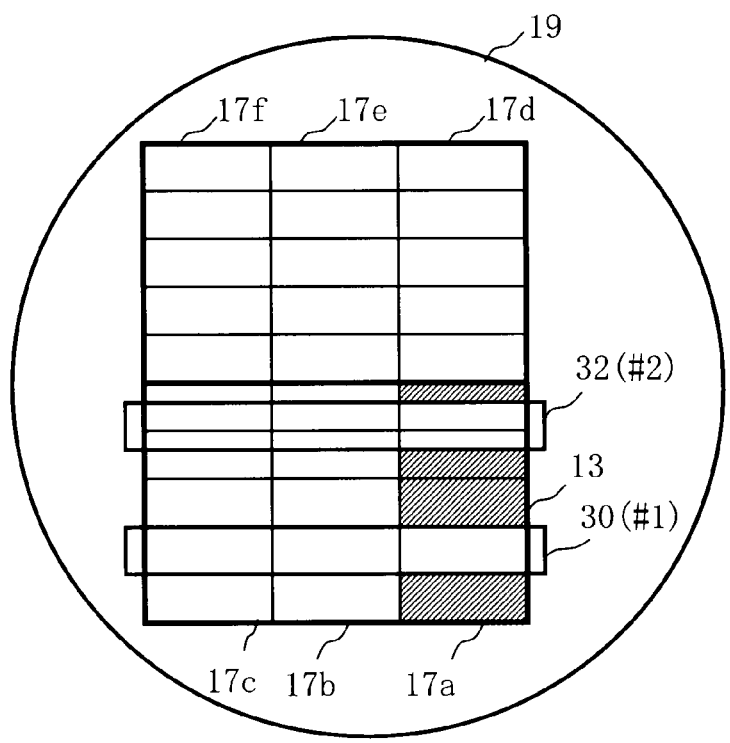
FIGS. 6A and 6B show schematic diagrams for illustrating an application example in the case of writing by the multi-columns described in Embodiment 1 when compared with a conventional method.
Figure 6B:
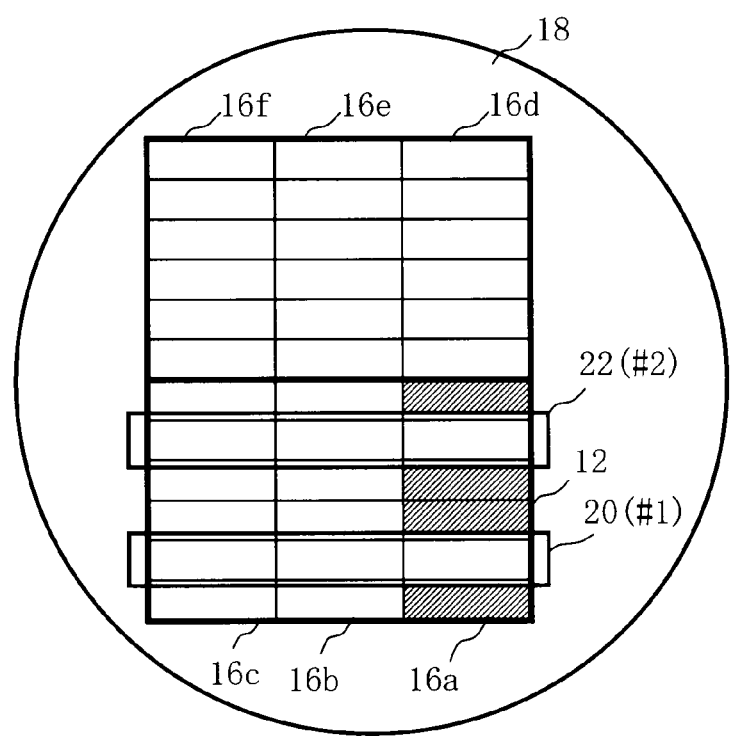

FIGS. 6A and 6B show schematic diagrams for illustrating an application example in the case of writing by the multi-columns described in Embodiment 1 when compared with a conventional method. FIG. 6A shows the case of writing the same six chips (3 chips×2 rows) of 17a to 17f on a wafer 19 by the conventional method. For example, it is assumed that the frame 13 composed of the three chips 17a to 17c of the same row will be written as one frame. When writing the frame 13 composed of the chips 17a to 17c of a certain row by the first column and another frame 13 composed of the chips 17a to 17c of a different row by the second column, a defect occurs as follows: That is, if the region 30, which can be written by the first column, is set to accord with the position of a certain frame, the region 32, which can be written by the second column, does not accord with the frame of another row. On the other hand, according to Embodiment 1, as shown in FIG. 6B, it is possible to match the positions. FIG. 6B shows the case of writing the same six chips (3 chips×2 rows) of 16a to 16f on a wafer 18 by the method of Embodiment 1. For example, it is assumed that the frame 12 composed of the same row of the three chips 16a to 16c will be written as one frame. In Embodiment 1, it is possible to write the frame 12 composed of the chips 16a to 16c of a certain row by the first column 220, and simultaneously or substantially simultaneously write another frame 12 composed of the chips 16a to 16c of a different row by the second column. That is, when the region 20, which can be written by the first column 220, is set to accord with the position of a certain frame 12, the region 22, which can be written by the second column 320, can accord with the position of the frame 12 of a different row, thereby simultaneously or substantially simultaneously writing the two frames of one chip.

Figure 7A:
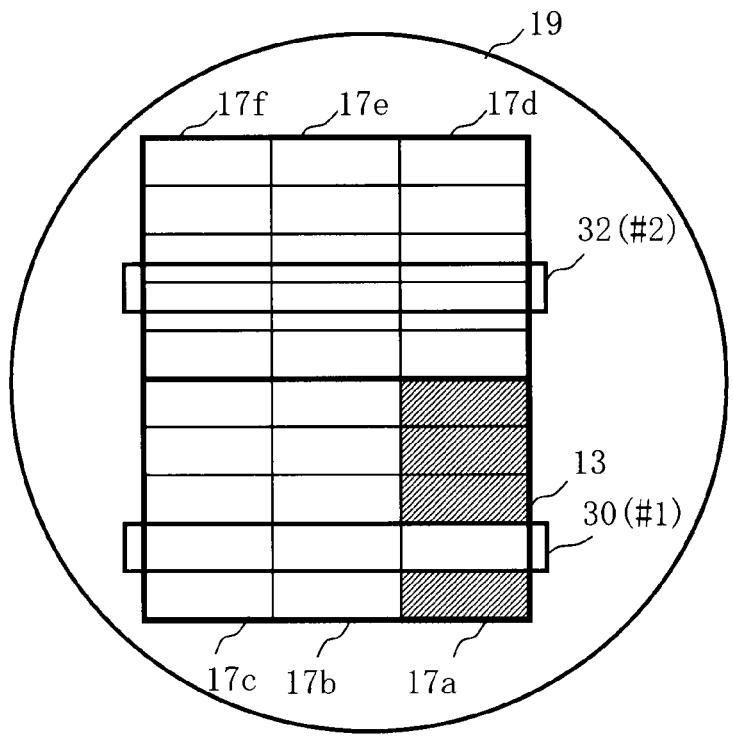
FIGS. 7A and 7B show schematic diagrams for illustrating another application example of writing by the multi-columns described in Embodiment 1 when compared with a conventional method.
Figure 7B:
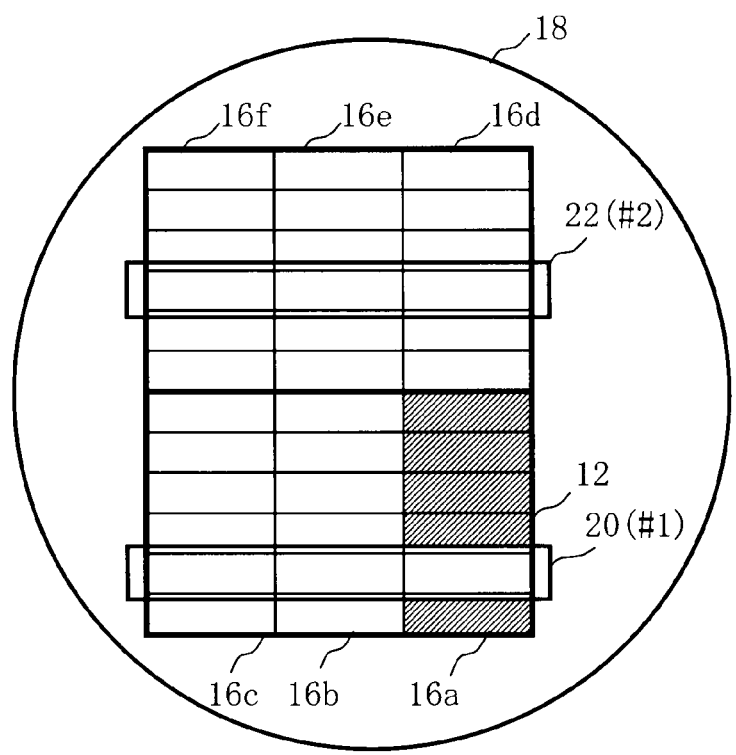

FIGS. 7A and 7B show schematic diagrams for illustrating another application example of writing by the multi-columns described in Embodiment 1, when compared with a conventional method. FIG. 7A shows the case of writing the same six chips (3 chips×2 rows) of 17a to 17f on the wafer 19 by the conventional method. For example, it is assumed that the frame 13 composed of the three chips 17a to 17c of the same row will be written as one frame. Similarly, it is assumed that another frame 13 composed of the three chips 17d to 17f of the same row will be written as one frame. When writing the frame 13 composed of the chips 17a to 17c of a certain row by the first column and another frame 13 composed of the upper chips 17d to 17f of a certain row by the second column, a defect occurs as follows: That is, if the region 30, which can be written by the first column, is set to accord with the position of a certain frame of the chips 17a to 17c, the region 32, which can be written by the second column, does not accord with the frame of chips 17d to 17f of any row. On the other hand, according to Embodiment 1, as shown in FIG. 7B, it is possible to match the positions. FIG. 7B shows the case of writing the same six chips (3 chips×2 rows) of 16a to 16f on the wafer 18 by the method of Embodiment 1. For example, it is assumed that the frame 12 composed of the three chips 16a to 16c of the same row will be written as one frame. Similarly, it is assumed that another frame 12 composed of the three chips 16d to 16f of the same row will be written as one frame. In Embodiment 1, it is possible to write the frame 12 composed of the chips 16a to 16c of a certain row by the first column 220, and simultaneously or substantially simultaneously write another frame 12 composed of the chips 16d to 16f of a certain row by the second column 320. That is, when the region 20, which can be written by the first column 220, is set to accord with the position of a certain frame 12 composed of the chips 16a to 16c, the region 22, which can be written by the second column 320, can accord with the position of a certain frame 12 of the chips 16d to 16f, thereby simultaneously or substantially simultaneously writing each frame of the two chips in the upper and lower rows.

Although FIGS. 6A and 6B, and FIGS. 7A and 7B describe the cases of directly writing chips on the wafer, it should be understood that what is described can be applied to the case of writing a plurality of chips on a mask.

Next, an application example in the case of performing multiple writing will be described. FIGS. 8A and FIG. 8B show schematic diagrams for illustrating an example of application in the case of performing multiple writing by the multi-columns described in Embodiment 1, when compared with a conventional method. FIG. 8A shows a plurality of frames 13 for the first writing, and a plurality of shifted frames 43 for the second writing in the writing region 11. A plurality of frames 13 are shown by the solid line, and a plurality of frames 43 are shown by the dotted line. When the region 30, which can be written by the first column, is set to accord with the position of a certain frame 13, the position of the region 32, which can be written by the second column, does not accord with the frame 13 of any row for the first writing, nor with the frame 43 of any row for the second writing. On the other hand, according to Embodiment 1, as shown in FIG. 8B, it is possible to match the positions. FIG. 8B shows a plurality of frames 12 for the first writing, and a plurality of shifted frames 42 for the second writing in the writing region 10. A plurality of frames 12 are shown by the solid line, and a plurality of frames 42 are shown by the dotted line. Although, in the example mentioned above, it is described that the frame width is defined as a value obtained by dividing the distance P between the optical centers of the columns 220 and 320 by an integer n, it is not limited thereto. For example, as shown in FIG. 8B, it is also preferable to set the frame width so that the distance between the centers of the frame 12 for the first writing and the frame 42 for the second writing may become the distance P between the optical centers of the columns 220 and 320. Thus, by performing such a setting as mentioned above, when the region 20, which can be written by the first column 220, is set to accord with the position of a certain frame 12 for the first writing, it is possible to match the region 22, which can be written by the second column 320, with the position of a certain row of the frame 42 for the second writing, thereby simultaneously or substantially simultaneously writing each of the frames for multiple writing.

Figures 9A, 9B:
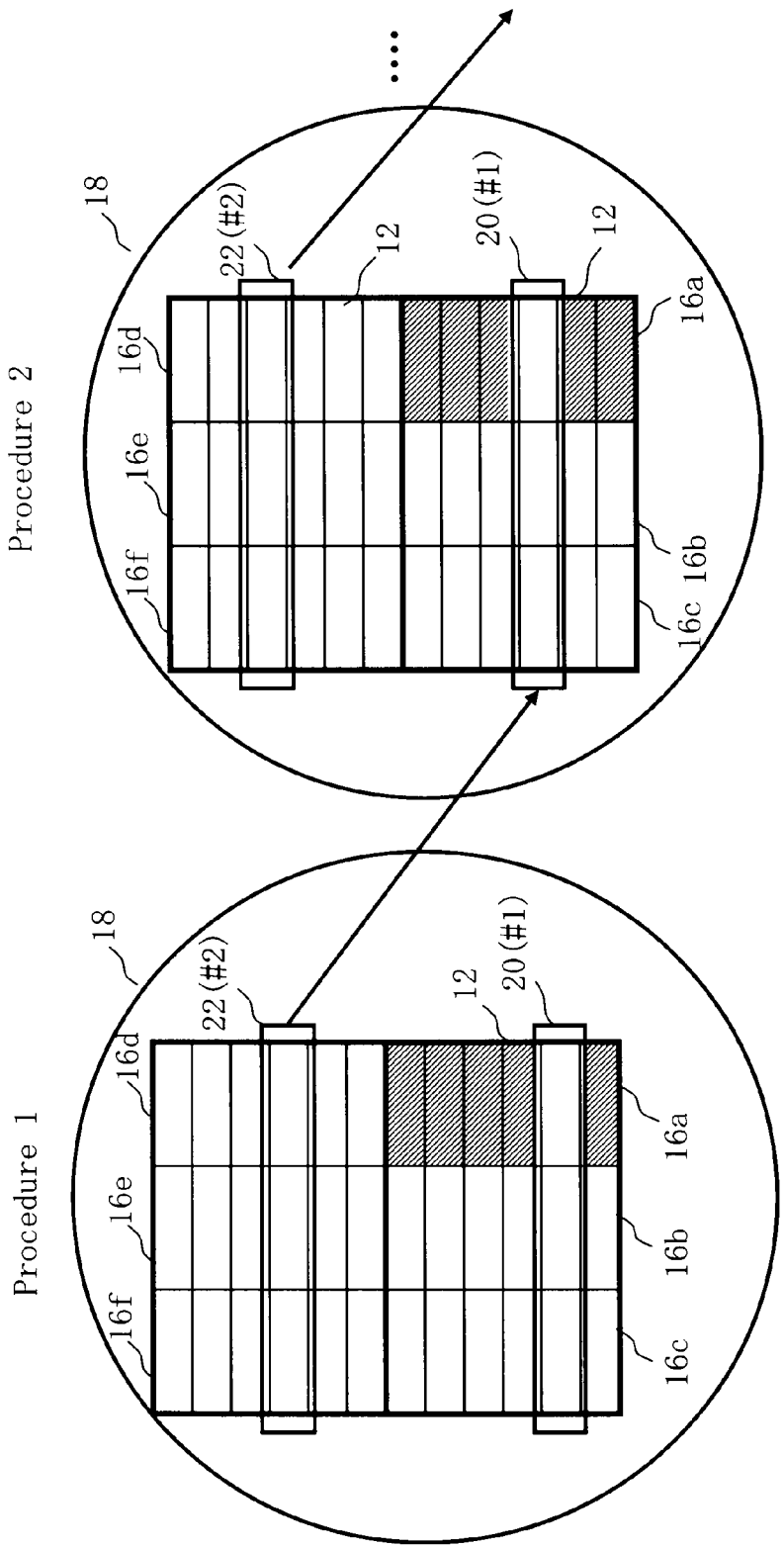
FIGS. 9A and 9B show schematic diagrams for illustrating an example of application in the case of reusing writing data by the multi-columns described in Embodiment 1.

Next, an example of application in the case of reusing writing data will be explained. FIGS. 9A and 9B show schematic diagrams for illustrating an example of application in the case of reusing writing data by the multi-columns described in Embodiment 1. FIG. 9A shows the case of writing the same six chips (3 chips×2 rows) of 16a to 16f on the wafer 18. For example, it is assumed that the frame 12 composed of the three chips 16a to 16c of the same row will be written as one frame. Similarly, it is assumed that another frame 12 composed of the three chips 16d to 16f of the same row will be written as one frame. Frame division is performed, when the region 20, which can be written by the first column 220, is set to accord with the position of the (k−1)th frame 12 of three chips 16a to 16c of a lower row, in order that the region 22, which can be written by the second column 320, can accord with the position of the k-th frame 12 of three chips 16d to 16f of an upper row. Then, the (k−1)th frame 12 of the three chips 16a to 16c of a lower row is written by the first column 220, and simultaneously or substantially simultaneously the k-th frame 12 of three chips 16d to 16f of an upper row is written by the second column. In such writing, the writing apparatus 100 operates as follows: For example, data of the (k−1)th frame is temporarily stored in the buffer memory 130, and data of the k-th frame is temporarily stored in the buffer memory 132. The deflection control circuit 120 reads the (k−1)th frame data from the buffer memory 130, and controls the deflection position of the electron beam 200. Then, the column 220 emits the electron beam 200 onto the position of the (k−1)th frame of the chip 16a (first chip) for example, based on the (k−1)th frame data read by the deflection control circuit 120. In the meantime, the deflection control circuit 122 reads the k-th frame data from the buffer memory 132, and controls the deflection position of the electron beam 300. Then, the column 320 emits the electron beam 300 onto the position of the k-th frame of chip 16d (second chip) for example, based on the k-th frame data read by the deflection control circuit 122.

Then subsequently, as shown in FIG. 9B, the k-th frame 12 of the three chips 16a to 16c of a lower row is written by the first column 220, and simultaneously or substantially simultaneously the (k+1)th frame 12 of three chips 16d to 16f of an upper row is written by the second column. In such writing, the writing apparatus 100 operates as follows: After the deflection control circuit 122 has read the k-th frame data from the buffer memory 132, the deflection control circuit 120, before the k-th frame data is rewritten by other data, reads the k-th frame data from the buffer memory 132, and controls the deflection position of the electron beam 200. Then, the column 220 emits the electron beam 200 onto the position of the k-th frame of the chip 16a (first chip) for example, based on the k-th frame data read by the deflection control circuit 120. In the meantime, the (k+1)th frame data output from the writing data processing circuit 110 is temporarily stored in the buffer memory 130. The deflection control circuit 122 reads the (k+1)th frame data from the buffer memory 130, and controls the deflection position of the electron beam 300. Then, the column 320 emits the electron beam 300 onto the position of the (k+1)th frame of the chip 16d (second chip) for example, based on the (k+1)th frame data read by the deflection control circuit 122. By performing these operations in order, frame data can be reused one by one. Thereby, it becomes unnecessary to separately calculate the frame data for column 220. Therefore, it becomes unnecessary to provide a facility, such as a calculator, in the writing apparatus 100.

Although the case of simultaneously or substantially simultaneously writing different frames by the two columns 220 and 320 is described in the example mentioned above, it is also preferable to simultaneously or substantially simultaneously write one frame by the two columns 220 and 320. The method of reducing the writing time by simultaneously or substantially simultaneously writing one frame by the two columns 220 and 320 will be described below.

Figure 10A:
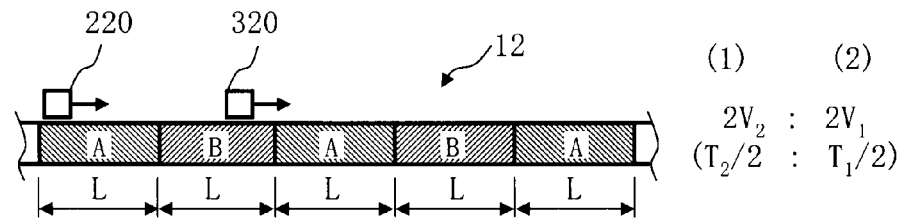
FIGS. 10A to 10E show schematic diagrams for illustrating a time series state in the case of writing the same frame by the multi-columns described in Embodiment 1.
Figure 10B:
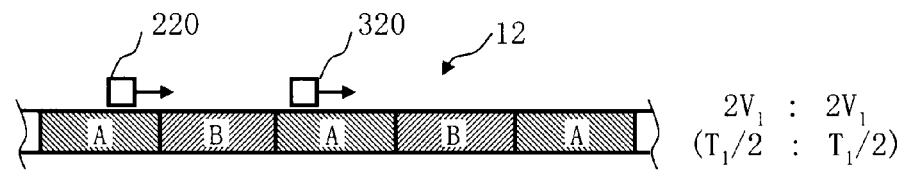
Figure 10C:
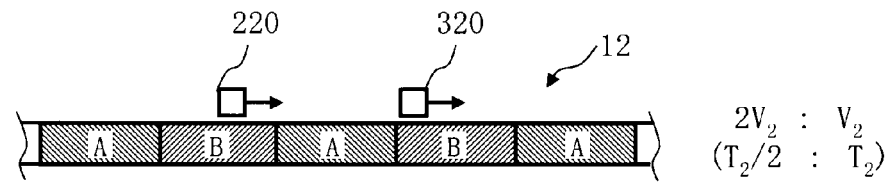
Figure 10D:
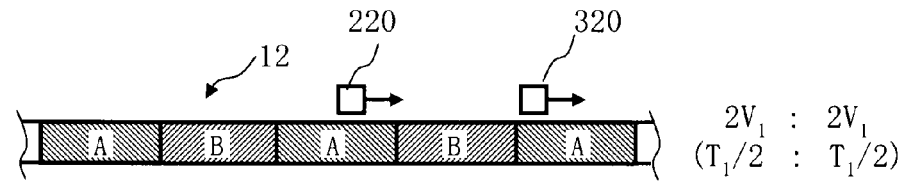
Figure 10E:
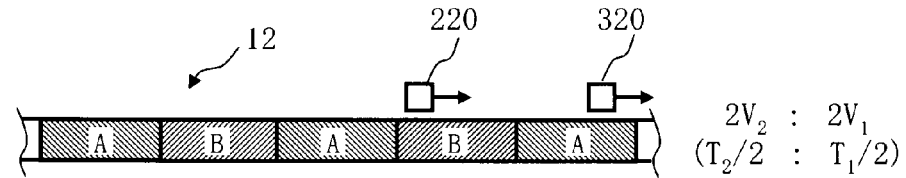

FIGS. 10A to 10E show schematic diagrams for illustrating a time series state in the case of writing the same frame by the multi-columns described in Embodiment 1. In FIGS. 10A to 10E, patterns of a region A having high density and a region B having low density, each having the same length L, are repeated in a certain frame 12. This frame 12 is written simultaneously or substantially simultaneously by the two columns 220 and 320 arranged forward and backward in the proceeding direction. When the XY stage 105 on which the target workpiece 101 is placed moves in a predetermined direction (reverse direction to the arrow), the two columns 220 and 320 relatively progress in the direction of the arrow. The two columns 220 and 320 are arranged in order along the predetermined direction mentioned above. The columns 220 and 320 write desired patterns in the frame 12 of the writing region of the target workpiece 101, using the electron beams 200 and 300 respectively. There is positional relation between the regions A and B and the columns 220 and 320 as follows: There is a case as shown in FIG. 10A where the column 220, at the back in the writing direction, is located in the region A, and the column 320, at the front in the writing direction, is located in the adjoining region B. There is another case as shown in FIG. 10B where the column 220, at the back in the writing direction, is located in the region A, and the column 320, at the front in the writing direction, is located in the next region A. There is another case as shown in FIG. 10C where the column 220, at the back in the writing direction, is located in the region B, and the column 320, at the front in the writing direction, is located in another region B. There is another case as shown in FIG. 10D where the column 220, at the back in the writing direction, is located in the region A, and the columns 320, at the front in the writing direction, is located in another region A. There is another case as shown in FIG. 10E where the column 220, at the back in the writing direction is located in the region B, and the column 320, at the front in the writing direction, is located in the adjoining region A. Drawing time with respect to these positional relations mentioned above will be explained below. Then, it is assumed that the stage speed in the case of writing the region A of low pattern density with a single beam is $V_1$, and the stage speed in the case of writing the region B of high pattern density with a single beam is $V_2$.

As a method (1), each of n columns writes 1/n of the pattern of the writing region of the target workpiece 101 by using an electron beam. That is, the n columns simultaneously or substantially simultaneously write corresponding patterns in n small regions respectively. Now, as an example, each of the two columns 220 and 320, using the electron beams 200 and 300, writes each half (½) of a desired pattern onto the writing region of the target workpiece 101 respectively. It is also, of course, preferable to use three or more columns for writing. The stage moves at a speed for writing a small region with the highest pattern density among n small regions. The stage speed at each position in FIGS. 10A to 10E is as follows: In the positional relation of FIG. 10A, the stage speed is $2V_2$. In that of FIG. 10B, the stage speed is $2V_1$. In that of FIG. 10C, the stage speed is $2V_2$. In that of FIG. 10D, the stage speed is $2V_1$. In that of FIG. 10E, the stage speed is $2V_2$. Therefore, writing time $t_1$ for writing three "A" regions and two "B" regions of the frame 12 is $3L/2V_2 + 2L/2V_1$. That is, the writing time can be shorter than writing all with a single beam.

By virtue of the structure described above, the speed of the stage can be increased n times because n columns simultaneously or substantially simultaneously write the regions of about the same pattern density. Moreover, when some of the n columns respectively write a region whose pattern density is higher than others, it is possible to write at n times the stage speed of writing the region concerned by one column.

As a method (2), in the case that at least two columns of the n columns are respectively located above a region where the number of shots of the at least two columns is larger than that of other regions, the at least two columns of the n columns perform writing processing simultaneously or substantially simultaneously by using electron beams, with given priority than other case. That is, by virtue of such a structure, priority is given to the case that at least two columns of the n columns write the regions of high pattern density. As to other cases, there is a case that one of the n columns writes a region of high pattern density and the others of the n columns write regions of low pattern density, and there is a case that all of the n columns write the regions of low pattern density. The number of shots is large in the region where pattern density is high, and the number of shots is small in the region where pattern density is low. When the writing positions of n columns are composed of a position in the region B with a large number of shots and positions in the region A with a small number of shots, only the columns located above the region A with a small number of shots among n columns are made to perform writing processing. That is, when some of the n columns are at the regions A and the other of the n columns is at the regions B, the column located above the region B with a large number of shots among the n columns is made to pass without performing writing processing. This is also one of the priority matters. As mentioned above, the apparatus 100 has a function of performing writing processing while giving priority. For example, when both the two columns 220 and 320 are respectively located above a region where the number of shots is larger than that of other regions, two columns 220 and 320 perform writing processing by using an electron beam, while being given priority. Also in the method (2), of course, it is preferable to perform writing by using three or more columns.

The stage speed at each position in FIGS. 10A to 10E is as follows: In the positional relation of FIG. 10A, the stage speed is $2V_1$. In that of FIG. 10B, the stage speed is $2V_1$. In that of FIG. 10C, the stage speed is $V_2$. In that of FIG. 10D, the stage speed is $2V_1$. In that of FIG. 10E, the stage speed is $2V_1$. That is, in the positional relation of FIG. 10A, the column 320 does not write the region B of high density. Moreover, although not illustrated, supposing that the region A and the region B are alternated with each other, in the positional relation prior to that of FIG. 10A, both the columns 220 and 320 will write the regions A. In that case, if each of the columns 220 and 320 writes each half (½) of a desired pattern respectively, the stage speed becomes fastest. Therefore, in the positional relation of FIG. 10A, since one half of the pattern in the region A has already been written by the column 320, the stage speed becomes the fastest $2V_1$. Similarly, in the positional relation of FIG. 10E, the column 220 does not write the region B of high density. Moreover, since the column 320 has already written one half (½) of the pattern in the region A in the positional relation of FIG. 10D, the stage speed in the positional relation of FIG. 10E becomes the fastest $2V_1$. Moreover, in the positional relation of FIG. 10C, since both the two columns 220 and 320 are located in the regions B where the number of shots is large, writing priority is given to this positional relation. Therefore, in the positional relation of FIG. 10C, both the columns 220 and 320 write all the patterns in the regions B respectively. Therefore, in the positional relation of FIG. 10C, the stage speed becomes $V_2$. Based on this result, writing time $t_2$ for writing three "A" regions and two "B" regions of the frame 12 becomes $L/V_2 + 4L/2V_1$.

Calculating the ratio between the writing time of the method (1) and that of the method (2), the following equation (1) can be obtained.

$$t_1/t_2 = (3L/2V_2 + 2L/2V_1)/(L/V_2 + 4L/2V_1) \quad \text{Equation (1)}$$
$$= (3/2V_2 + 2/2V_1)/(1/V_2 + 4/2V_1)$$
$$= (3V_1 + 2V_2)/(2V_1 + 4V_2)$$

Let $V_1 = kV_2$ (k>1). Then, the equation (1) can be further expressed as an equation (2) described below.

$$(3V_1 + 2V_2)/(2V_1 + 4V_2) = (3k+2)/(2k+4) \quad \text{Equation (2)}$$
$$= 3/2 - 4/(2k+4)$$
$$= 3/2 - 2/(k+2)$$

Thus, when k is infinite, the method (2) can attain 1.5 times the high speed of the method (1). Moreover, when k is 10, the method (2) can attain 1.333 times the high speed of the method (1). When k>=2, the method (2) can attain higher speed than that of the method (1). Therefore, depending upon the value of k, the method (2) can further shorten the writing time compared with the method (1).

In the example mentioned above, calculation is performed based on the stage speed. Next, when calculation is similarly performed based on the writing time of each region, it becomes as follows: It is assumed that the writing time in the case of writing the region A of low pattern density with a single beam is $T_1$, and the writing time in the case of writing the region B of high pattern density with a single beam is $T_2$.

First, it will be as follows according to the method (1). In the positional relation of FIG. 10A, the writing time is $T_2/2$. In that of FIG. 10B, the writing time is $T_1/2$. In that of FIG. 10C, the writing time is $T_2/2$. In that of FIG. 10D, the writing time is $T_1/2$. In that of FIG. 10E, the writing time is $T_2/2$. Thus, the writing time $t_1$ for writing three "A" regions and two "B" regions of the frame 12 becomes $3T_2/2+2T_1/2$.

It will be as follows according to the method (2). In the positional relation of FIG. 10A, the writing time is $T_1/2$. In that of FIG. 10B, the writing time is $T_1/2$. In that of FIG. 10C, the writing time is $T_2$. In that of FIG. 10D, the writing time is $T_1/2$. In that of FIG. 10E, the writing time is $T_1/2$. Thus, the writing time $t_2$ for writing three "A" regions and two "B" regions of the frame 12 becomes $T_2+4T_1/2$.

Calculating the ratio between the writing time of the method (1) and that of the method (2), the following equation (3) can be obtained.

$$t_1/t_2 = (3T_2/2 + 2T_1/2)/(T_2 + 4T_1/2) \quad \text{Equation (3)}$$
$$= (3T_2 + 2T_1)/(2T_2 + 4T_1)$$

Let $T_2=kT_1$ ($k>1$). Then, the equation (3) can be further expressed as an equation (4) described below.

$$(3T_2 + 2T_1)/(2T_2 + 4T_1) = 3/2 - 2/(k+2) \quad \text{Equation (4)}$$

Thus, when k is infinite, the method (2) can attain 1.5 times the high speed of the method (1). Moreover, when k is 10, the method (2) can attain 1.333 times the high speed of the method (1). When k>=2, the method (2) can attain higher speed than that of the method (1). Therefore, depending upon the value of k, the method (2) can further shorten the writing time compared with the method (1). As mentioned above, writing time of the writing apparatus 100 can be reduced by that each of at least two columns has a function of performing writing processing while giving priority to a region where the number of shots is larger than that of other regions.

Embodiment 2

Figure 11:
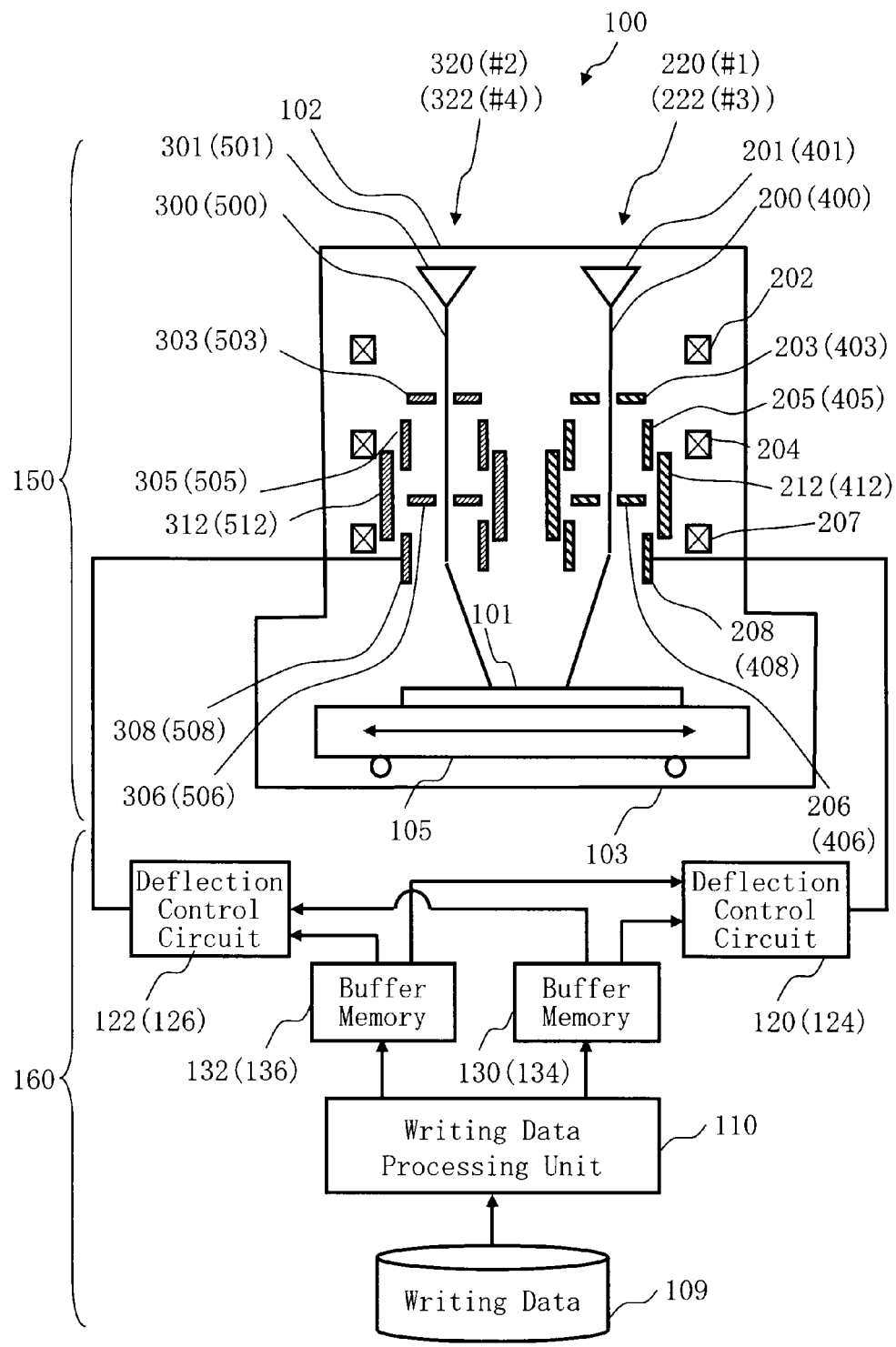
FIG. 11 shows a schematic diagram illustrating a structure of a writing apparatus in Embodiment 2.

FIG. 11 shows a schematic diagram illustrating a structure of a writing apparatus described in Embodiment 2. In FIG. 11, in the electron lens barrel 102, in addition to the structure elements of FIG. 1, there are further arranged shielding cylinder 412 and 512, electron gun assemblies 401 and 501, first aperture plates 403 and 503, deflectors 405 ad 505, second aperture plates 406 and 506, and deflectors 408 and 508. Then, a third column 222 is composed of the electron gun assembly 401, the first aperture plate 403, the deflector 405, the second aperture plate 406, the shielding cylinder 412 and the deflector 408. A fourth column 322 is composed of the electron gun assembly 501, the first aperture plate 503, the deflector 505, the second aperture plate 506, the shielding cylinder 512, and the deflector 508. In the electron lens barrel 102, a plurality of columns 220, 320, 222, and 322 are provided while the lens systems, such as the illumination lens 202, the projection lens 204, and the objective lens 207 are used in common among the columns. The subsystem which controls an optical path of an independent electron beam is herein also called a column. Other respects are the same as those in FIG. 1. The apparatus structure is the same as that obtained by adding two more columns to the two columns shown in FIG. 1. For example, the first and the second columns, located front and back, write one stripe region simultaneously or substantially simultaneously. Moreover, for example, the third and the fourth columns, located front and back, write another stripe region simultaneously or substantially simultaneously. The control unit 160 further includes deflection control circuits 124 and 126 and buffer memories 134 and 136 in addition to the structure of FIG. 1. While only the structure elements necessary for explaining Embodiment 2 are shown in FIG. 11, it should be understood that other structure elements generally necessary for the pattern writing apparatus 100 may also be included. Moreover, the structure of the writing data creation apparatus 600 is the same as that of FIG. 3.

The writing data processing circuit 110 reads writing data from the magnetic disk drive 109, and converts it into data of a format unique to the apparatus by performing a parallel processing of a plurality of calculators 112. Position deflection data of the column 220 is output to the buffer memories 130, 132, 134, or 136. Similarly, position deflection data of the column 320 is output to the buffer memories 130, 132, 134, or 136. Similarly, position deflection data of the column 222 is output to the buffer memories 130, 132, 134, or 136. Similarly, position deflection data of the column 322 is output to the buffer memories 130, 132, 134, or 136. Then, the deflection data in one of the buffer memories is output to the deflection control circuit 120 for the column 220. Similarly, the deflection data in one of the buffer memories is output to the deflection control circuit 122 for the column 320. Similarly, the deflection data of one of the buffer memories is output to the deflection control circuit 124 for the column 222. Similarly, the deflection data of one of the buffer memories is output to the deflection control circuit 126 for the column 322. Then, the deflector 208 is deflection-controlled based on the output from the deflection control circuit 120. Similarly, the deflector 308 is deflection-controlled based on the output from the deflection control circuit 122. Similarly, the deflector 408 is deflection-controlled based on the output from the deflection control circuit 124. Similarly, the deflector 508 is deflection-controlled based on the output from the deflection control circuit 126. The deflection control circuits 120, 122, 124, and 126 serve as examples of a deflection control unit. The buffer memories 130, 132, 134, and 136 serve as examples of a storage unit or a storage device.

The operation in the column 222 or the column 322 is the same as that in the column 220 or the column 320. First, the operation at the column 222 side is as follows: An electron beam 400 emitted from the electron gun assembly 401, which is an example of an emitting unit, irradiates the whole of the first aperture plate 403 having an opening or "hole" in the shape of a rectangle, by using the illumination lens 202. Then, the electron beam 400 is shaped to be a rectangle. Such a rectangular shape may be a square, rhombus, rhomboid, etc. Then, after having passed through the first aperture plate 403, the electron beam 400 of a first aperture image is projected onto the second aperture plate 406 by the projection lens 204. The position of the first aperture image on the second aperture plate 406 is deflection-controlled by the deflector 405, and thereby the shape and size of the beam can be changed. That is, the electron beam 400 is formed. After having passed through the second aperture plate 406, the electron beam 400 of a second aperture image is focused by the objective lens 207 and deflected by the deflector 408 to reach a desired position on the target workpiece 101 placed on the XY stage 105 which moves continuously.

Similarly, the operation at the column 322 side is as follows: An electron beam 500 emitted from the electron gun assembly 501, which is an example of an emitting unit, irradiates the whole of the first aperture plate 503 having an opening in the shape of a rectangle, by using the illumination lens 202. Then, the electron beam 500 is shaped to be a rectangle. Such a rectangular shape may be a square, rhombus, rhomboid, etc. Then, after having passed through the first aperture plate 503, the electron beam 500 of a first aperture image is projected onto the second aperture plate 506 by the projection lens 204. The position of the first aperture image on the second aperture plate 506 is deflection-controlled by the deflector 505, and thereby the shape and size of the beam can be changed. That is, the electron beam 500 is formed. After having passed through the second aperture plate 506, the electron beam 500 of a second aperture image is focused by the objective lens 207 and deflected by the deflector 508 to reach a desired position on the target workpiece 101 placed on the XY stage 105 which moves continuously.

Figure 12:
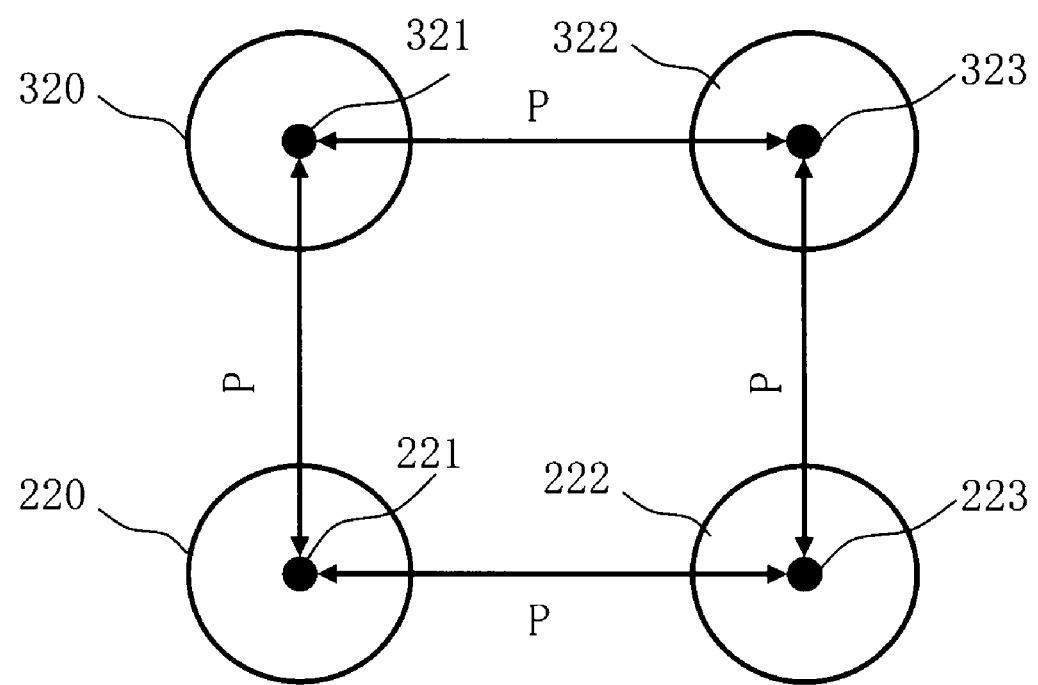
FIG. 12 shows a schematic diagram for illustrating distance between optical centers of four columns in Embodiment 2.

In Embodiment 2, information on distance between the optical centers of the columns 220, 320, 222, and 322 is stored in the magnetic disk drive 606 of FIG. 3. Drawing data is created as follows:

First, as an input step, the input unit 612 inputs the information on distance between the optical centers of a plurality of columns 220, 320, 222, and 322. FIG. 12 shows a schematic diagram for illustrating the distance between the optical centers of the four columns described in Embodiment 2. FIG. 12 shows the case where the distance between the optical center 221 of the column 220 and the optical center 321 of the column 320 is P, the distance between the optical center 321 of the column 320 and the optical center 323 of the column 322 is P, the distance between the optical center 323 of the column 322 and the optical center 223 of the column 222 is P, and the distance between the optical center 223 of the column 222 and the optical center 221 of the column 220 is P. That is, FIG. 12 shows the case where the four columns 220, 320, 222, and 322 are arranged in two lines and two rows (two lines× two rows) having the distance P between each other. Therefore, the value P is stored in the magnetic disk drive 606 as distance information between the optical centers of the columns 220, 320, 222, and 322.

Next, as a dividing step, the input unit 612 inputs layout data from the magnetic disk drive 602. Then, the virtual dividing unit 614 virtually divides the writing region indicated by the layout data into a plurality of frames (small regions) by the width of one integer-th of the distance indicated by the distance information with respect to the directions X and Y. In the following, the steps after the creation step are the same as those described in Embodiment 1.

Figure 13A:
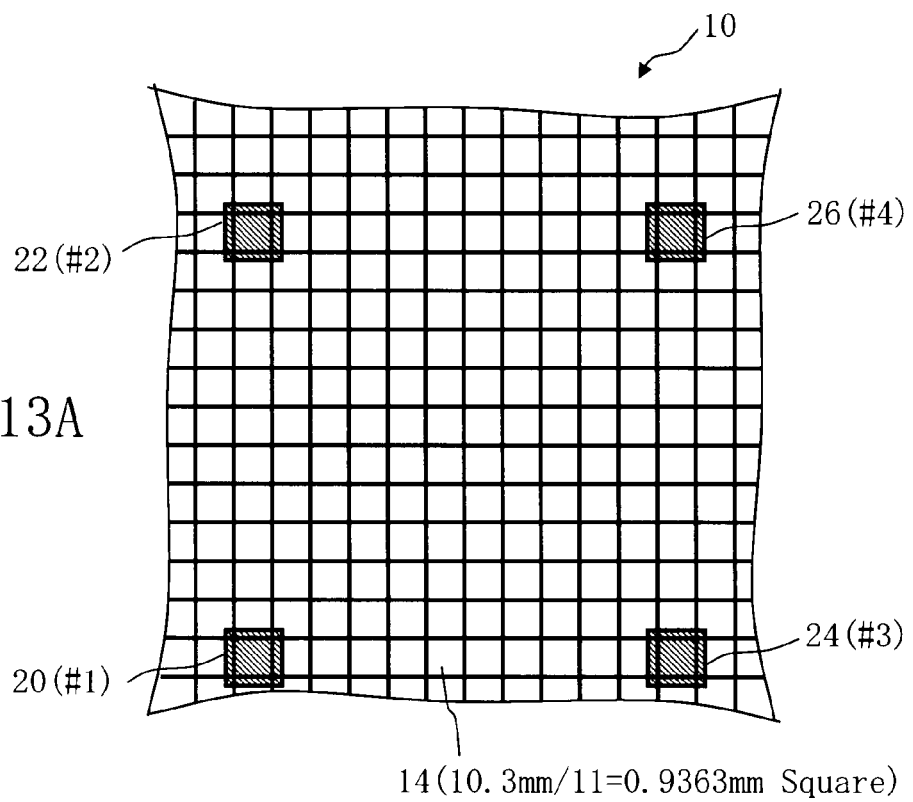
FIGS. 13A and 13B show schematic diagrams for illustrating how to divide the region into frames according to Embodiment 2 when compared with a conventional method.
Figure 13B:
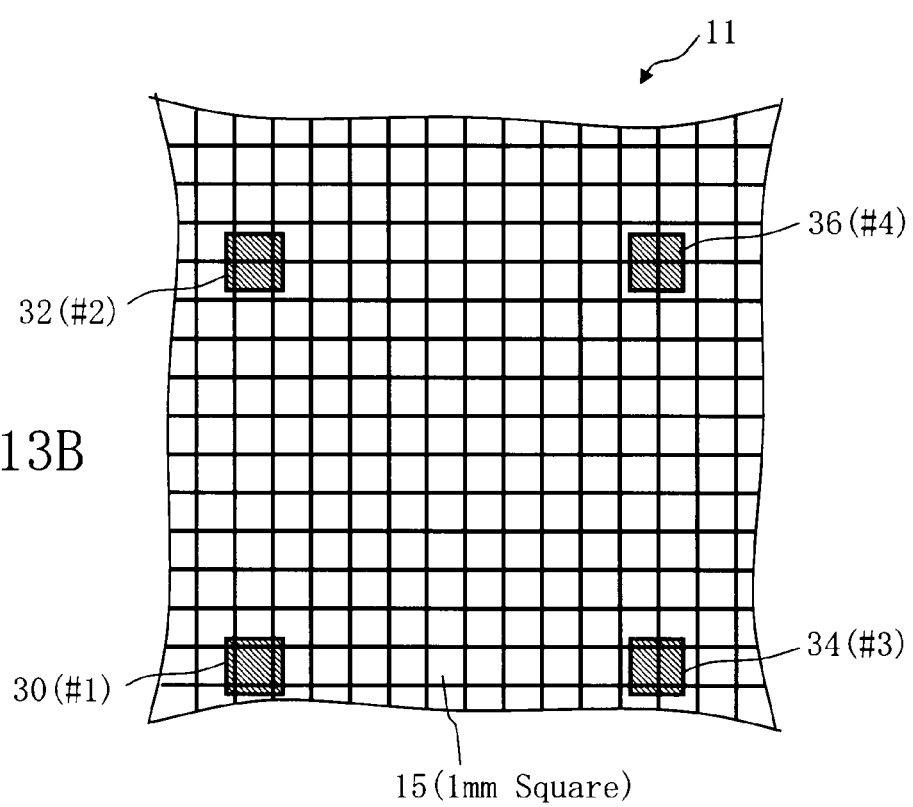

FIGS. 13A and 13B show schematic diagrams for illustrating how to divide the region into frames according to Embodiment 2, when compared with a conventional method. They show frame divisions of the conventional method and Embodiment 2 in the case of the distance P between two optical centers of the columns 220, 320, 222, and 322 being 10.3 mm, for example. In the conventional way, for example, the writing region 11 indicated by the layout data is virtually divided into a plurality of frames 15 of 1 mm square, regardless of the distance P, and that is, the writing data is created to have the width of 1 mm. As a result, positional displacement occurs as shown in FIG. 13B. There are shown in FIG. 13B the region 30 which can be written by the first column, the region 32 which can be written by the second column, a region 34 which can be written by the third column, and a region 36 which can be written by the fourth column. As shown in FIG. 13B, when the first column performs writing processing for the frame 15 at the coordinates (n,1), the region 32, which can be written by the second column, does not accord with the positional relation of the divided frame 15. Similarly, the region 34, which can be written by the third column, does not accord with the positional relation of the divided frame 15. Similarly, the region 36, which can be written by the fourth column, does not accord with the positional relation of the divided frame 15. Therefore, writing processing cannot be performed by the second, the third, and the fourth columns. Alternatively, if the writing is continued in such a state, there will exist a region protruding from the deflectable region. On the other hand, according to Embodiment 2, the value obtained by dividing the distance P by an integer n is defined as a frame width in length and in width. Then, it is preferable to set the value of the integer n so that the calculated quotient may not exceed 1 mm+α of being a writable width. In the case of FIG. 13A, the value "11" is used as the integer n. Thereby, the frame width can be within the width deflectable by the deflectors 208, 308, 408, and 508. In this case, the writing region 10 indicated by the layout data is virtually divided into a plurality of mesh-like frames 14, by the width 0.9363 mm which is obtained by dividing 10.3 mm by 11. In FIG. 13A, there are shown the region 20 which can be written by the first column 220, the region 22 which can be written by the second column 320, a region 24 which can be written by the third column 222, and a region 26 which can be written by the fourth column 322. As shown in FIG. 13A, when the first column 220 performs writing processing for the frame 14 at the coordinates (n,1), the position of the region 22, which can be written by the second column 320, can accord with the position of the frame 14 at the coordinates (n, l+11). The position of the region 24, which can be written by the third column 222, can accord with the position of the frame 14 at the coordinates (n+11, 1). The position of the region 26, which can be written by the fourth column 322, can accord with the position of the frame 14 at the coordinates (n+11, l+11). Thus, it is possible to perform writing processing even by the second, the third, and the fourth columns.

As mentioned above, the writing data for writing a pattern on the target workpiece 101 can be created by using the writing apparatus 100 in which a plurality of columns to emit electron beams are provided. Also in Embodiment 2, the region of writing data is divided by the width of one integer-th of the distance between the optical centers of a plurality of columns in order to be mesh-like regions, thereby eliminating positional displacement. Thus, not only can the writing time be shortened by simultaneously or substantially simultaneously performing writing processing by using the multi-columns, but also highly precise writing processing can be performed.

Although the case of dividing the region into mesh-like frames is described in the example mentioned above, it is also preferable to divide it into strip-like frames like Embodiment 1. It should be understood that the application example explained in Embodiment 1 is also applicable to the writing apparatus 100 provided with four columns. Moreover, in the writing apparatus of Embodiment 2, if each two of the four columns are grouped by arranging each of the two columns at the front and back in the writing direction on the same frame, and the two groups are arranged on different frames respectively, it becomes possible to apply one of the application examples illustrated in FIGS. 6 to 9 and the application example illustrated in FIG. 10 simultaneously or substantially simultaneously.

Figure 14:
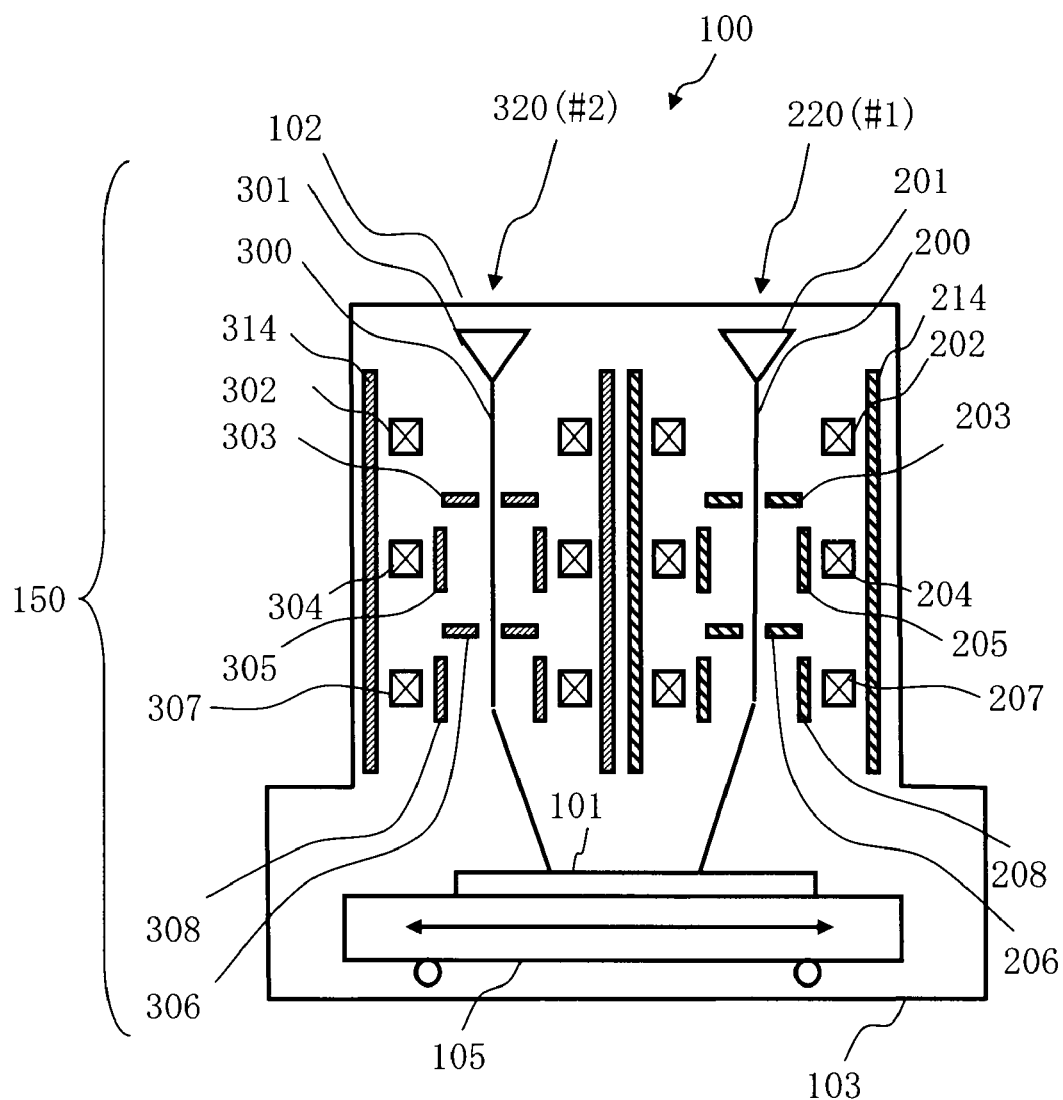
FIG. 14 shows a schematic diagram illustrating a structure of a writing apparatus provided with multi-columns, in which the lens system is independently provided.
Figure 15:
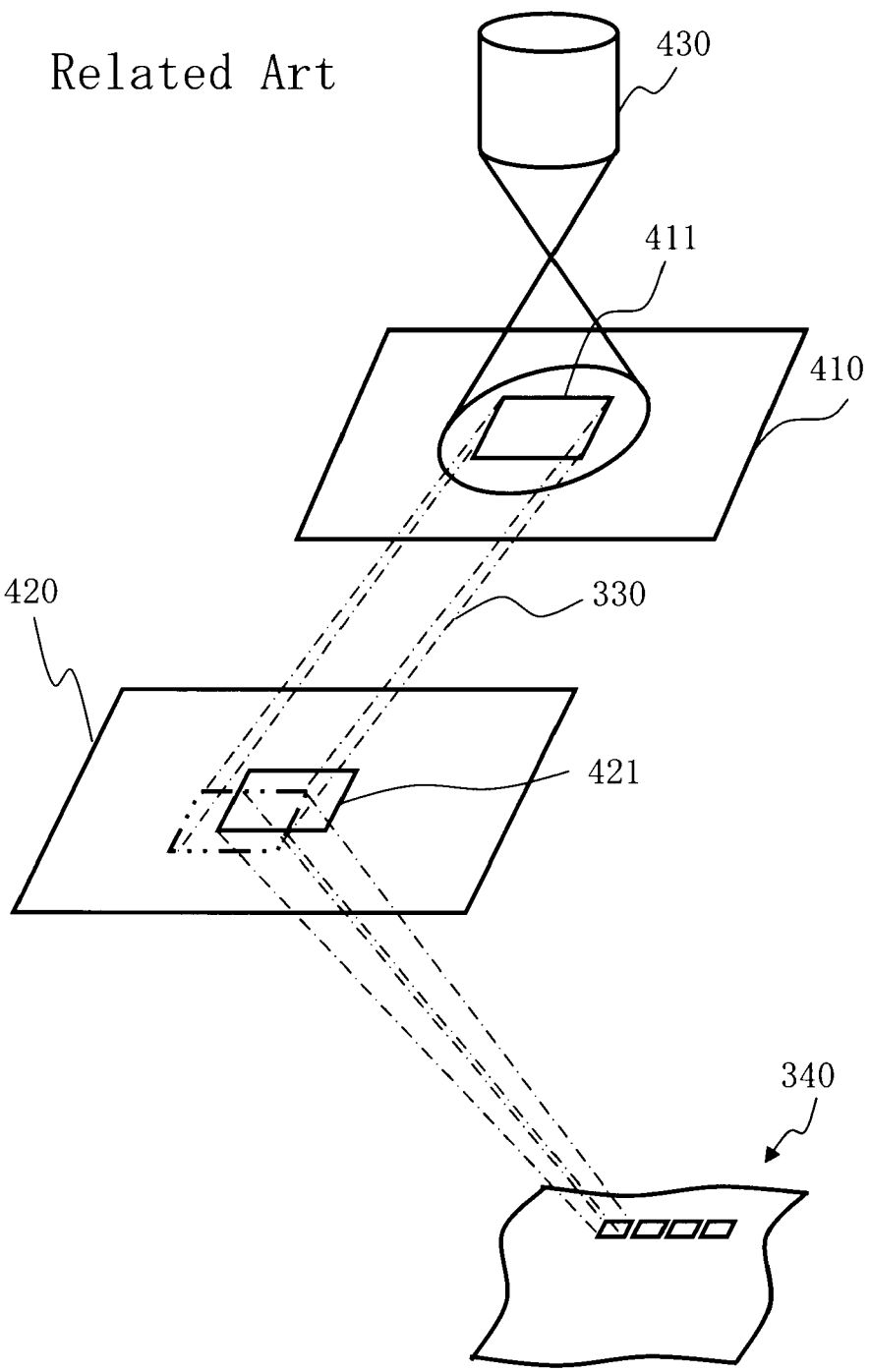
FIG. 15 shows a schematic diagram for illustrating operations of a conventional variable-shaped electron beam writing apparatus.

In the above explanation, although the writing apparatus 100 provided with multi-columns explained in Embodiments 1 and 2 has a structure in which each electron lens is used in common, it is not limited to such a structure. FIG. 14 shows a schematic diagram illustrating a structure of a writing apparatus provided with multi-columns, in which the lens system is independently provided. FIG. 14 shows the case of the two multi-columns 220 and 320 corresponding to FIG. 1, as an example. Although not shown, the control unit is similar o that shown in FIG. 1. The first column 220 is composed of the electron gun assembly 201, the illumination lens 202, the first aperture plate 203, the projection lens 204, the deflector 205, the second aperture plate 206, the objective lens 207, the deflector 208, and an insulated column 214. The second column 320 is composed of the electron gun assembly 301, the illumination lens 302, the first aperture plate 303, the projection lens 304, the deflector 305, the second aperture plate 306, an objective lens 307, the deflector 308, and an insulated column 314. Although lens systems, such as the illumination lens 202, the projection lens 204, and the objective lens 207 are used in common among the columns in Embodiments 1 and 2 mentioned above, it is also preferable for the electron lens barrel 102 to be provided with a plurality of columns, in each of which the lens system is independently provided, as shown in FIG. 13. In the insulated column 214, there are provided the electron gun assembly 201, the illumination lens 202, the first aperture plate 203, the projection lens 204, the deflector 205, the second aperture plate 206, the objective lens 207, and the deflector 208. Similarly, in the insulated column 314, there are provided the electron gun assembly 301, the illumination lens 302, the first aperture plate 303, the projection lens 304, the deflector 305, the second aperture plate 306, the objective lens 307, and the deflector 308. Thus, by placing the subsystem for controlling an optical path of an independent electron beam in each insulated column in order to be insulated from the other insulated column, it is possible to eliminate the influence of the electric field and the magnetic field of the other column. It should be understood that it is also preferable to make the lens system be independent in each column even in the case of a plurality of columns, for example four columns of 2×2, being provided.

According to each Embodiment mentioned above, it is possible to match the positional relation of the distance between the optical centers of each column of multi-columns with each region obtained by a region dividing. Thus, it is possible to write a pattern in a region deflectable by a deflector of the writing apparatus. Therefore, it is possible to achieve a highly precise writing. Moreover, according to each Embodiment, the number of times of operation processing can be reduced. Therefore, it becomes unnecessary to provide a facility, such as a calculator. Furthermore, according to each Embodiment, the writing time can be shortened.

While the embodiments have been described above with reference to specific examples, the present invention is not limited to these specific ones.

While description of the apparatus structure, control method, etc. not directly required for explaining the present invention is omitted, it is possible to suitably select and use some or all of them when needed. For example, although the structure of the control unit for controlling the writing apparatus 100 is not described, it should be understood that a necessary control unit structure may be selected and used appropriately.

In addition, any other charged particle beam writing method and apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of creating writing data for writing a pattern on a target workpiece by using a writing apparatus provided with a plurality of columns that emit charged particle beams, comprising:
    inputting information on distance between optical centers of the plurality of columns variably shaping charged particle beams and emitting the charged particle beams variably shaped to the target workpiece;
    inputting layout data and virtually dividing a writing region indicated by the layout data into a plurality of small regions, by a width of one integer-th of the distance indicated by the information on distance;
    converting, for each small region, the layout data to a format adaptable to the writing apparatus to create, for the each small region, the writing data whose writing region is divided into the small regions and which is used for at least one of the plurality of columns variably shaping charged particle beams and emitting the charged particle beams variably shaped to the target workpiece; and
    outputting the writing data.

2. The method according to claim 1, wherein a value of the integer is set so that a quotient obtained by dividing the distance by the integer is equal to or less than a width which can be written by the plurality of columns.

3. A charged particle beam writing apparatus comprising:
    a storage unit configured to temporarily store a k-th frame data of a first chip;
    a first deflection control unit configured to read the k-th frame data from the storage unit, and control a deflection position of a first charged particle beam;
    a first column configured to emit the first charged particle beam onto a k-th frame position of the first chip, based on the k-th frame data read by the first deflection control unit;
    a second deflection control unit configured to read the k-th frame data from the storage unit after the k-th frame data having been read from the storage unit by the first deflection control unit and before the k-th frame data being rewritten by other data, and control a deflection position of a second charged particle beam; and
    a second column configured to emit the second charged particle beam onto the k-th frame position of a second chip, based on the k-th frame data read by the second deflection control unit.

4. The apparatus according to claim 3, wherein both a width of a k-th frame of the first chip and a width of a k-th frame of the second chip are a width of one integer-th of a distance between optical centers of the first column and the second column.

5. The apparatus according to claim 4, wherein the first column writes a pattern on another frame of the first chip, which is different from a frame of the first chip corresponding to a frame of the second chip written by the second column, at a substantially same time as writing by the second column.

6. A charged particle beam writing apparatus comprising:
    a stage configured to mount a target workpiece thereon and move in a predetermined direction; and
    n columns, arranged in the predetermined direction in order, configured to write a corresponding pattern in a small region of 1/n of a writing region of the target workpiece, using a charged particle beam, respectively, wherein the stage moves at a speed for writing a small region of highest pattern density among the n small regions.

7. The apparatus according to claim 6, wherein the n columns substantially simultaneously write the corresponding pattern in n small regions respectively.

8. A charged particle beam writing apparatus comprising:
a stage configured to mount a target workpiece thereon and move in a predetermined direction; and
n columns, arranged in the predetermined direction in order, configured to perform writing processing using a charged particle beam,
wherein, in a case that at least two columns are respectively located above a region where a number of shots is larger than that of other region, the apparatus has a function of performing writing processing while giving priority than other case.

9. The apparatus according to claim 8, wherein, when writing positions of the n columns are composed of a region with a large number of shots and at least one region with a small number of shots, only at least one column located at the region with a small number of shots among the n columns performs writing processing.

* * * * *